(12) United States Patent
Chen et al.

(10) Patent No.: US 11,081,592 B2
(45) Date of Patent: Aug. 3, 2021

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: I-Sheng Chen, Hsinchu (TW); Szu-Wei Huang, Hsinchu (TW); Hung-Li Chiang, Taipei (TW); Cheng-Hsien Wu, Hsinchu (TW); Chih Chieh Yeh, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/196,329

(22) Filed: Nov. 20, 2018

(65) Prior Publication Data
US 2019/0088797 A1 Mar. 21, 2019

Related U.S. Application Data

(62) Division of application No. 15/719,121, filed on Sep. 28, 2017, now Pat. No. 10,522,694.
(Continued)

(51) Int. Cl.
*H01L 29/786* (2006.01)
*H01L 29/66* (2006.01)
(Continued)

(52) U.S. Cl.
CPC ........ *H01L 29/78696* (2013.01); *B82Y 10/00* (2013.01); *H01L 21/823807* (2013.01);
(Continued)

(58) Field of Classification Search
CPC .......... H01L 29/78696; H01L 29/1033; H01L 29/42392; H01L 29/66757
See application file for complete search history.

(56) References Cited

U.S. PATENT DOCUMENTS 8,440,517 B2 * 5/2013 Lin .................. H01L 21/02293
438/197
8,936,972 B2 1/2015 Bangsaruntip et al.
(Continued)

FOREIGN PATENT DOCUMENTS

| CN | 104011849 A | 8/2014 |
| CN | 105789304 A | 7/2016 |
| KR | 10-2016-0099445 A | 8/2016 |

OTHER PUBLICATIONS

Baldauf et al., "Stress-Dependent Performance Optimization of Reconfigurable Silicon Nanowire Transistors," IEEE Electron Device Letters, vol. 36, No. 10, 2015, pp. 991-993.*
(Continued)

*Primary Examiner* — Julia Slutsker
(74) *Attorney, Agent, or Firm* — McDermott Will & Emery LLP

(57) ABSTRACT

A semiconductor device includes channel layers disposed over a substrate, a source/drain region disposed over the substrate, a gate dielectric layer disposed on and wrapping each of the channel layers, and a gate electrode layer disposed on the gate dielectric layer and wrapping each of the channel layers. Each of the channel layers includes a semiconductor wire made of a core region, and one or more shell regions. The core region has an approximately square-shape cross section and a first shell of the one or more shells forms a first shell region of an approximately rhombus-shape cross section around the core region and is connected to an adjacent first shell region corresponding to a neighboring semiconductor wire.

20 Claims, 29 Drawing Sheets

Related U.S. Application Data

(60) Provisional application No. 62/434,808, filed on Dec. 15, 2016.

(51) Int. Cl.

| | |
|---|---|
| *H01L 29/423* | (2006.01) |
| *H01L 29/10* | (2006.01) |
| *H01L 29/78* | (2006.01) |
| *H01L 29/06* | (2006.01) |
| *B82Y 10/00* | (2011.01) |
| *H01L 29/40* | (2006.01) |
| *H01L 29/775* | (2006.01) |
| *H01L 29/04* | (2006.01) |
| *H01L 21/8238* | (2006.01) |
| *H01L 27/04* | (2006.01) |

(52) U.S. Cl.
CPC ............ *H01L 27/04* (2013.01); *H01L 29/045* (2013.01); *H01L 29/0657* (2013.01); *H01L 29/0673* (2013.01); *H01L 29/1033* (2013.01); *H01L 29/401* (2013.01); *H01L 29/4238* (2013.01); *H01L 29/42364* (2013.01); *H01L 29/42372* (2013.01); *H01L 29/42376* (2013.01); *H01L 29/42392* (2013.01); *H01L 29/66439* (2013.01); *H01L 29/66545* (2013.01); *H01L 29/66757* (2013.01); *H01L 29/775* (2013.01); *H01L 29/7827* (2013.01)

(56) References Cited

U.S. PATENT DOCUMENTS

| | | | |
|---|---|---|---|
| 9,209,247 B2 | 12/2015 | Colinge et al. | |
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu | |
| 9,608,116 B2 | 3/2017 | Ching et al. | |
| 2011/0018065 A1* | 1/2011 | Curatola | H01L 29/0665 257/368 |
| 2014/0034908 A1 | 2/2014 | Bangsaruntip et al. | |
| 2014/0197377 A1* | 7/2014 | Kim | H01L 21/823828 257/29 |
| 2016/0079422 A1 | 3/2016 | Rachmady et al. | |
| 2016/0204195 A1 | 7/2016 | Wen et al. | |
| 2016/0204263 A1* | 7/2016 | Mukherjee | H01L 29/42392 257/76 |
| 2016/0218179 A1* | 7/2016 | Feng | H01L 21/02603 |
| 2016/0240652 A1* | 8/2016 | Ching | H01L 29/42392 |
| 2018/0047853 A1 | 2/2018 | Chang et al. | |
| 2018/0090388 A1 | 3/2018 | Anderson et al. | |
| 2018/0138289 A1 | 5/2018 | Rachmady et al. | |

OTHER PUBLICATIONS

Non-Final Office Action issued in related U.S. Appl. No. 15/719,121, dated Mar. 19, 2019.

Final Office Action issued in related U.S. Appl. No. 15/719,121, dated Nov. 15, 2018.

Non-Final Office Action issued in related U.S. Appl. No. 15/719,121, dated Jul. 12, 2018.

Office Action issued in related U.S. Appl. No. 15/719,121, dated Feb. 13, 2018.

* cited by examiner

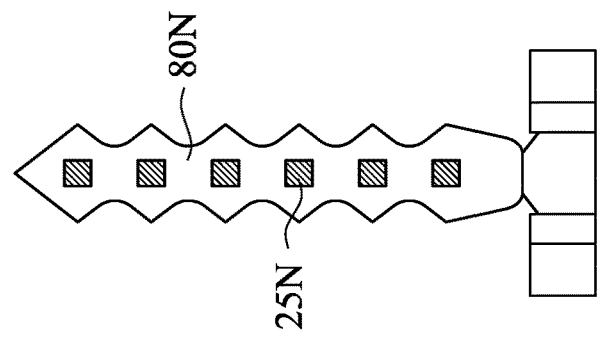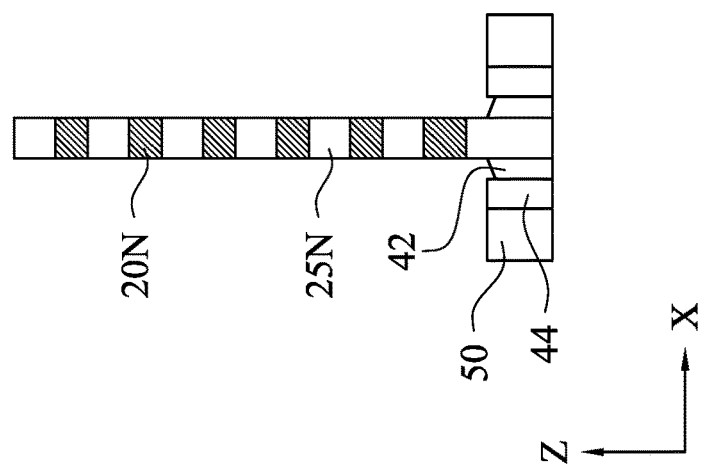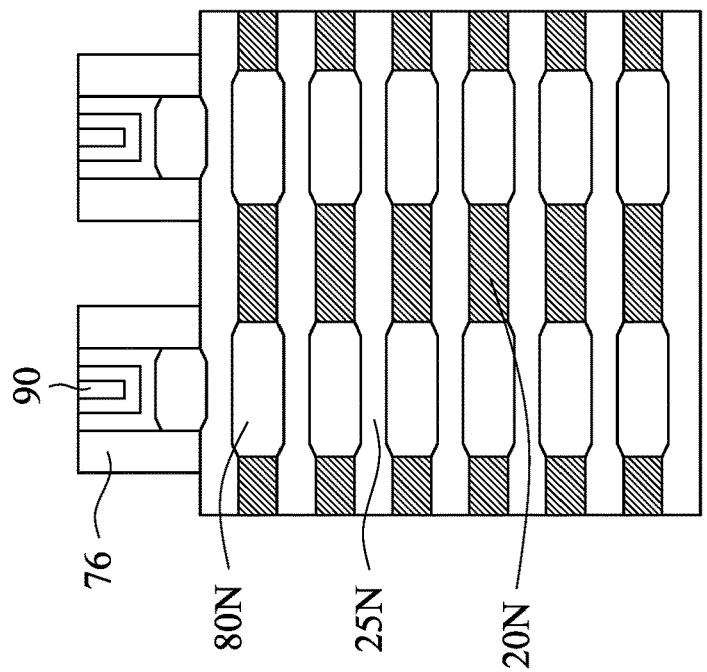
FIG. 16C
FIG. 16B
FIG. 16A

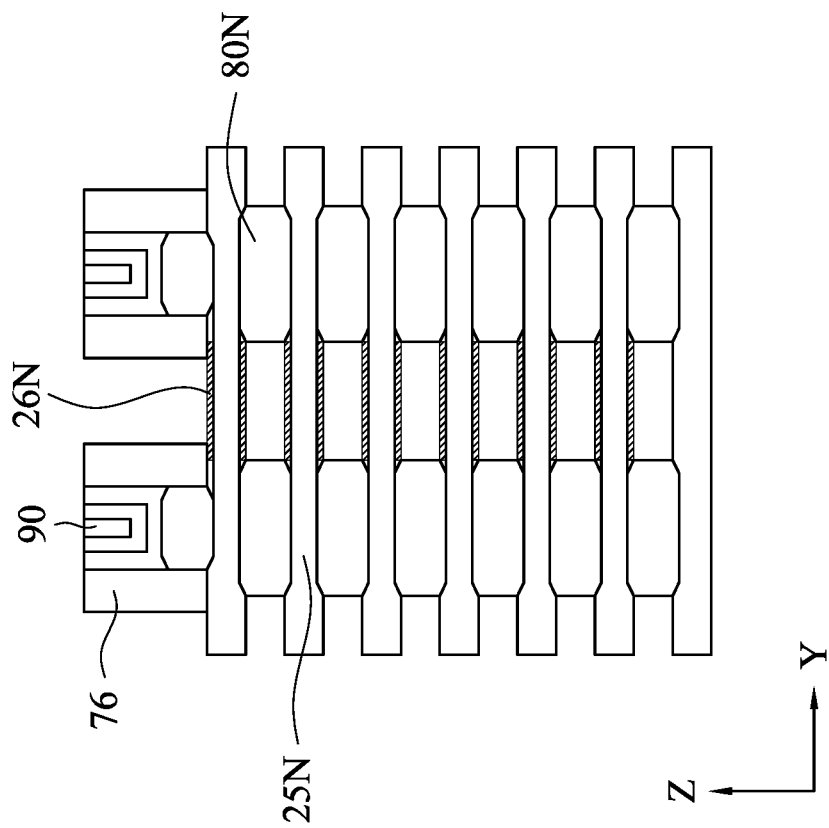
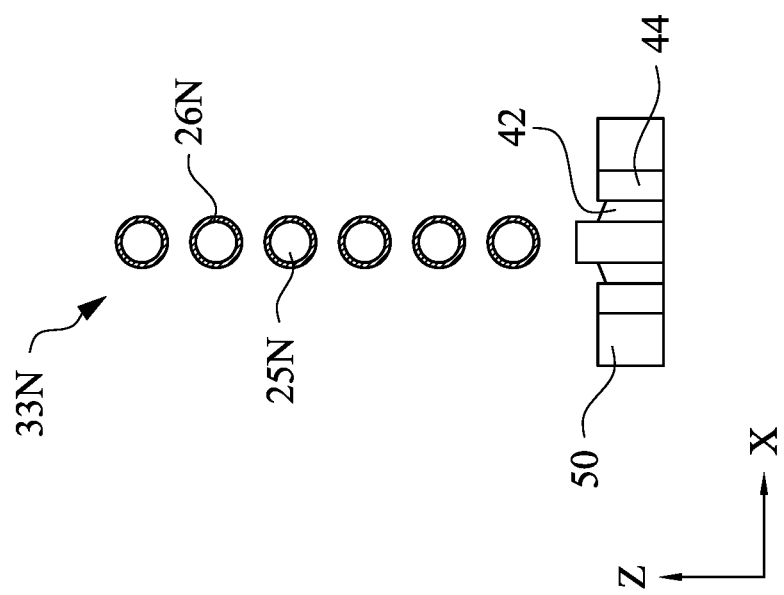
FIG. 21A
FIG. 21B

| Channel Stress | Core-Multi-Shell 95-1 | | Core-Multi-Shell 95-2 | | Core-Shell 95-3 | | PCL (NBD) 95-4 | Mobility Preferred Stress 95-5 | |
|---|---|---|---|---|---|---|---|---|---|
| | Inner | Outer | Inner | Outer | NFET | PFET | PFET | NFET | PFET |
| Core Ge% | 50% | | 30% | | 50% | | -- | -- | -- |
| Shell Ge% | 100% | 0% | 60% | 0% | 0% | 100% | -- | -- | -- |
| $S_{xx}$ (GPa) | -3.2 | 4.8 | -2.1 | 2.9 | +3.1 | -2.6 | -1.8 | Tensile | Compressive |
| $S_{yy}$ (GPa) | -1.6 | 2.7 | -1.0 | 1.6 | +0.8 | -0.6 | -- | Tensile | Tensile |
| $S_{zz}$ (GPa) | -1.6 | 2.7 | -1.0 | 1.7 | +0.8 | -0.7 | -1.3 | Compressive | Tensile |
| Type | Biaxial-Like | | Biaxial-Like | | Uniaxial-Like | | Biaxial | Uniaxial | Uniaxial |

SEMICONDUCTOR DEVICE AND MANUFACTURING METHOD THEREOF

CROSS-REFERENCE TO RELATED APPLICATIONS

This application is a divisional application of application Ser. No. 15/719,121 filed on Sep. 28, 2017, which claims the benefit of priority to U.S. Provisional Patent Application 62/434,808 filed Dec. 15, 2016, the entire disclosures of each of which are incorporated herein by reference.

TECHNICAL FIELD

The disclosure relates to a semiconductor integrated circuit, and more particularly to a semiconductor device having a gate-all-around structure including shape engineered core/shell channels and its manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a fin FET (Fin FET) and a gate-all-around (GAA) FET. In a Fin FET, a gate electrode is adjacent to three side surfaces of a channel region with a gate dielectric layer interposed therebetween. Because the gate structure surrounds (wraps) the fin on three surfaces, the transistor essentially has three gates controlling the current through the fin or channel region. The fourth side (e.g., the bottom part) of the channel, however, is far away from the gate electrode and thus is not under close gate control. In contrast, in a GAA FET, all side surfaces of the channel region are surrounded by the gate electrode, which allows for fuller depletion in the channel region and results in less short-channel effects due to a steeper sub-threshold current swing (SS) and smaller drain induced barrier lowering (DIBL).

As transistor dimensions are continually scaled down to sub 10-15 nm technology nodes, further improvements of the GAA FET are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 16A, 16B and 16C show some of various structures before forming multilayer semiconductor wires in an n-type FET region for a GAA FET device according to one embodiment of the present disclosure.

FIGS. 21A and 21B show one of various cross-sectional views of multilayer semiconductor wire channels in an n-type region of a GAA FET device after core layers and the shell layers are formed according to one embodiment of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Figure 1:
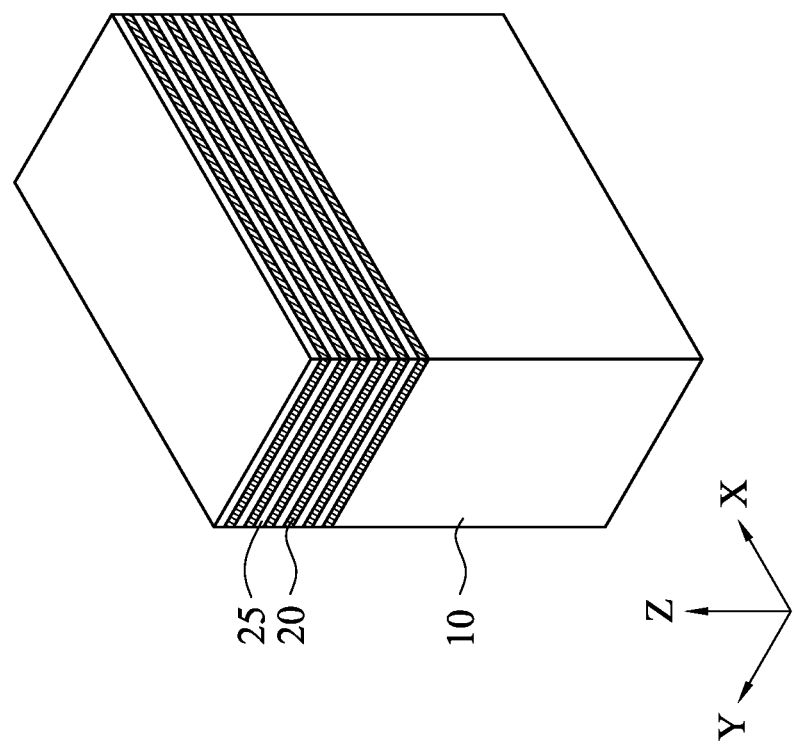
FIG. 1 shows one of various stages of sequential manufacturing process of a multi-layer structure of a GAA FET device according to some embodiments of the present disclosure.

FIG. 1 shows one of the various stages for a sequential manufacturing process of a multi-layer structure of a GAA FET device according to embodiments of the present disclosure. It is understood that in the sequential manufacturing process, one or more additional operations can be provided before, during, and after the stages shown in the drawings, and some of the operations described below can be replaced or eliminated for additional embodiments of the method. The order of the operations/processes may be interchangeable.

As shown in FIG. 1, stacked semiconductor layers are formed over a substrate 10. The stacked semiconductor layers include first semiconductor layers 20 and second semiconductor layers 25.

In one embodiment, substrate 10 includes a single crystalline semiconductor layer on at least its surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In this embodiment, the substrate 10 is made of Si.

The substrate 10 may include in its surface region, one or more buffer layers (not shown). The buffer layers can serve to gradually change the lattice constant from that of the substrate to that of the source/drain regions. In the present disclosure, a source and drain are interchangeably used and there is substantially no structural difference. The term "a source/drain" (an S/D) refers to one of a source and a drain. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer.

The first semiconductor layers 20 and the second semiconductor layers 25 are made of materials having different lattice constants, and may include one or more layers of Si, Ge, SiGe, GaAs, InSb, GaP, GaSb, InAlAs, InGaAs, GaSbP, GaAsSb and InP.

In some embodiments, the first semiconductor layers 20 and the second semiconductor layers 25 are made of Si, a Si compound, SiGe, Ge or a Ge compound. In one embodiment, the first semiconductor layers 20 are $Si_{1-x}Ge_x$, where x is more than about 0.3, or Ge (x=1.0) and the second semiconductor layers 25 are Si or $Si_{1-y}Ge_y$, where y is less than about 0.4, and x>y. In this disclosure, an "M" compound" or an "M based compound" means the majority of the compound is M.

In another embodiment, the second semiconductor layers 25 are $Si_{1-y}Ge_y$, where y is more than about 0.3, or Ge, and the first semiconductor layers 20 are Si or $Si_{1-y}Ge_x$, where x is less than about 0.4, and x<y. In yet other embodiments, the first semiconductor layer 20 is made of $Si_{1-y}Ge_x$, where x is in a range from about 0.3 to about 0.8, and the second semiconductor layer 25 is made of $Si_{1-y}Ge_x$, where x is in a range from about 0.1 to about 0.4. In one embodiment of the present disclosure, the first semiconductor layers 20 are made of $Si_{1-y}Ge_x$, where 0.1<x<0.9 (hereinafter referred to as SiGe), and the second semiconductor layers 25 are made of Si.

In FIG. 1, six layers of the first semiconductor layer 20 and six layers of the second semiconductor layer 25 are disposed. However, the number of the layers are not limited to six, and may be as small as 1 (each layer). In some embodiments, 2-10 layers of each of the first and second semiconductor layers are formed. By adjusting the numbers of the stacked layers, a driving current of the GAA FET device can be adjusted.

The first semiconductor layers 20 and the second semiconductor layers 25 are epitaxially formed over the substrate 10. The thickness of the first semiconductor layers 20 may be equal to or greater than that of the second semiconductor layers 25, and is in a range from about 5 nm to about 50 nm in some embodiments, and is in a range from about 10 nm to about 30 nm in other embodiments. The thickness of the second semiconductor layers 25 is in a range from about 5 nm to about 30 nm in some embodiments, and is in a range from about 10 nm to about 20 nm in other embodiments. The thickness of each of the first semiconductor layers 20 may be the same, or may vary.

In some embodiments, the bottom first semiconductor layer (the closest layer to the substrate 10) is thicker than the remaining first semiconductor layers. The thickness of the bottom first semiconductor layer is in a range from about 10 nm to about 50 nm in some embodiments, and is in a range from 20 nm to 40 nm in other embodiments.

Figure 2:
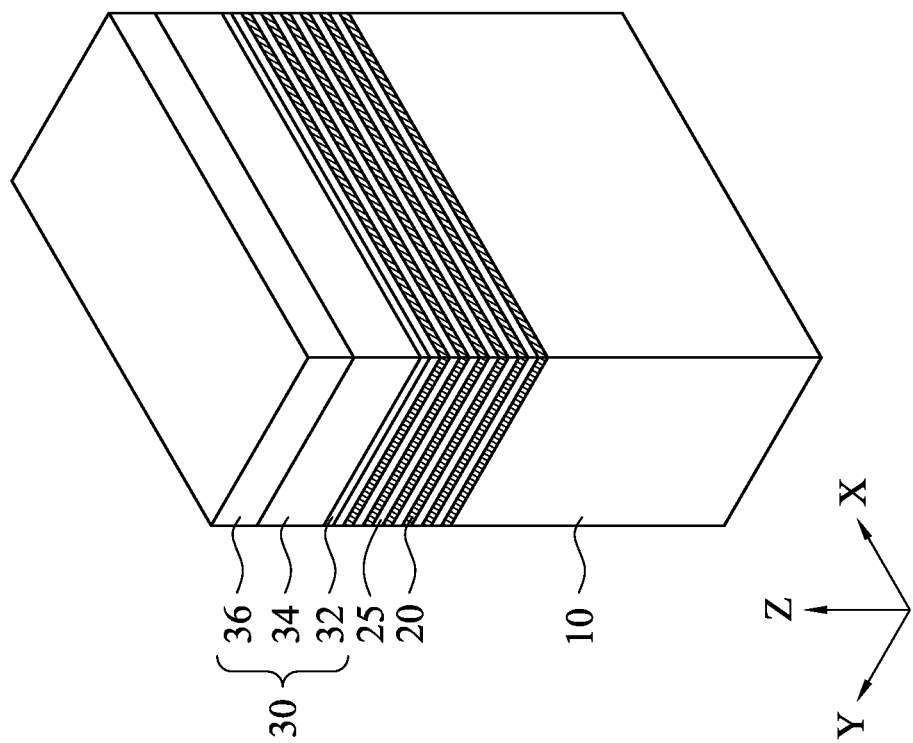
FIG. 2 shows one of various stages of sequential manufacturing process of the multi-layer structure of a GAA FET device according to one embodiment of the present disclosure.

FIG. 2 shows one of the various stages for a sequential manufacturing process of the multi-layer structure of a GAA FET device according to one embodiment of the present disclosure. As shown in FIG. 2, a mask layer 30 is formed over the stacked layers. In some embodiments, the mask layer 30 includes a first mask layer 32, a second mask layer 34 and a third mask layer 36. The first mask layer 32 is a pad oxide layer made of a silicon oxide, which can be formed by a thermal oxidation. The second mask layer 34 is made of a silicon nitride (SiN) and the third mask layer 36 is made of a silicon oxide, both of which are formed by chemical vapor deposition (CVD), including low pressure CVD (LPCVD) and plasma enhanced CVD (PECVD); physical vapor deposition (PVD); atomic layer deposition (ALD); or other suitable process. The mask layer 30 is patterned into a mask pattern by using patterning operations including photolithography and etching.

Figure 3:
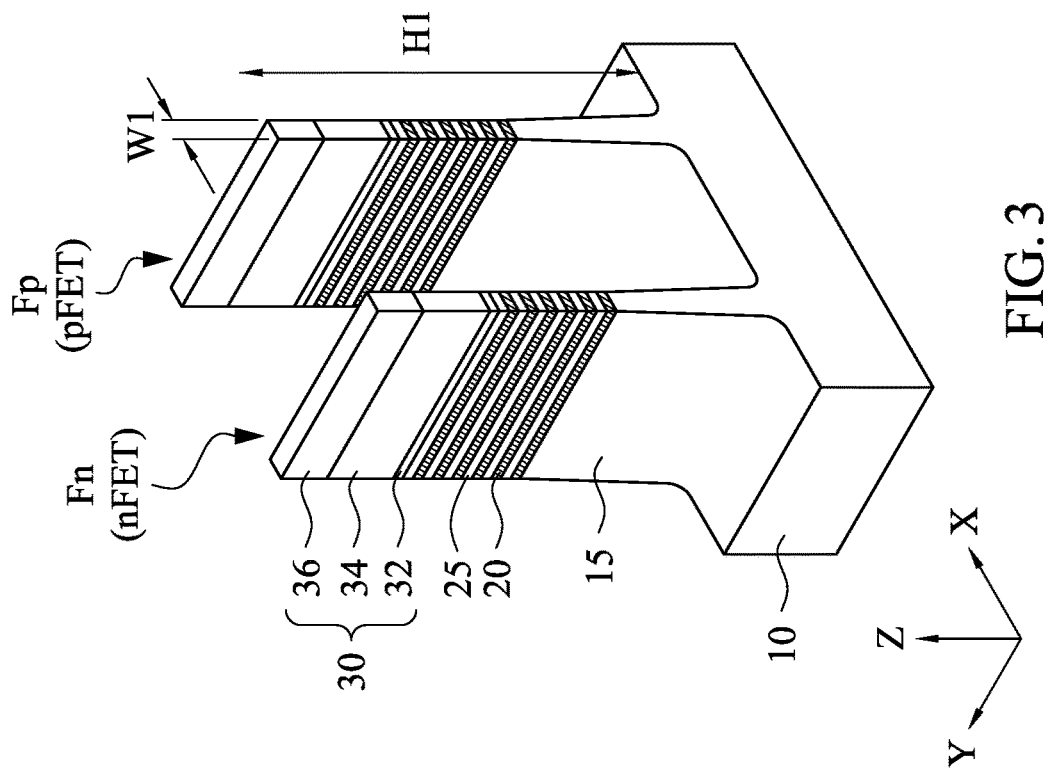
FIG. 3 shows one of various stages of sequential manufacturing process of fin structures of a GAA FET device according to one embodiment of the present disclosure.

FIG. 3 shows one of various stages of sequential manufacturing process of fin structures of a GAA FET device according to one embodiment of the present disclosure. As shown in FIG. 3, the stacked layers of the first and second semiconductor layers 20, 25 are patterned by using the patterned mask layer, thereby the stacked layers are formed into fin structures Fn and Fp extending in the Y direction. In the subsequent fabrication operations, the fin structure Fn is used to form an n-type FET, and the fin structure Fp is used to formed a p-type FET. Each of the fin structures includes a bottom layer 15, which is a part of the etched substrate.

The fin structures may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin structures.

The width W1 of the fin structure along the X direction is in a range from about 5 nm to about 40 nm in some embodiments, and is in a range from about 6 nm to about 15 nm in other embodiments. The height H1 along the Z direction of the fin structure is in a range from about 30 nm to about 200 nm.

Figure 4:
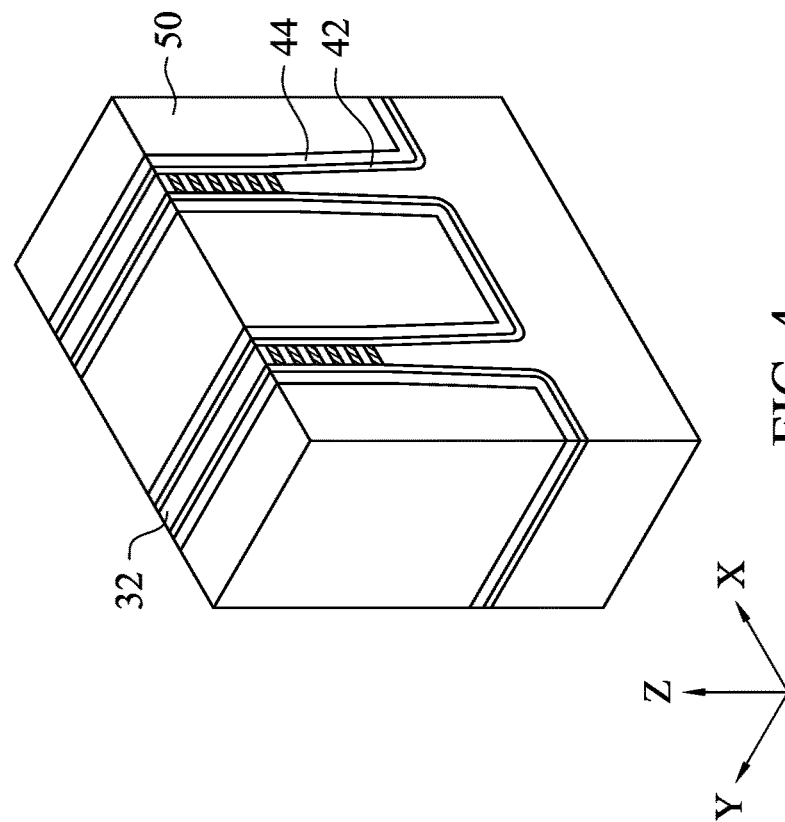
FIG. 4 shows one of various stages of sequential manufacturing process of isolation insulating layer of a GAA FET device according to one embodiment of the present disclosure.

FIG. 4 one of various stages of sequential manufacturing process of isolation insulating layer of a GAA FET device according to one embodiment of the present disclosure. After the fin structure is formed, as shown in FIG. 4, an isolation insulating layer 50 including one or more layers of insulating material is formed over the substrate so that the fin structures are fully embedded in the insulating layer 50. The insulating material for the insulating layer 50 may include silicon oxide, silicon nitride, silicon oxynitride (SiON), SiOCN, fluorine-doped silicate glass (FSG), or a low-K dielectric material, formed by LPCVD (low pressure chemical vapor deposition), plasma-CVD or flowable CVD. An anneal operation may be performed after the formation of the insulating layer 50. Then, a planarization operation, such as a chemical mechanical polishing (CMP) method and/or an etch-back method, is performed such that the upper surface of the pad oxide layer 32 is exposed from the insulating material layer as shown in FIG. 4. In some embodiments, the upper surface of the fin structures is exposed.

In some embodiments, a first liner layer 42 is formed over the structure of FIG. 3 and a second liner layer 44 is further formed over the first liner layer 42, as shown FIG. 4. The first liner layer 42 is made of silicon oxide or a silicon oxide-based material and the second liner layer 44 is made of SiN or a silicon nitride-based material. In some embodiments, the second liner layer 44 is made of silicon oxide or a silicon oxide-based material and the first liner layer 42 is made of SiN or a silicon nitride-based material.

Figure 5:
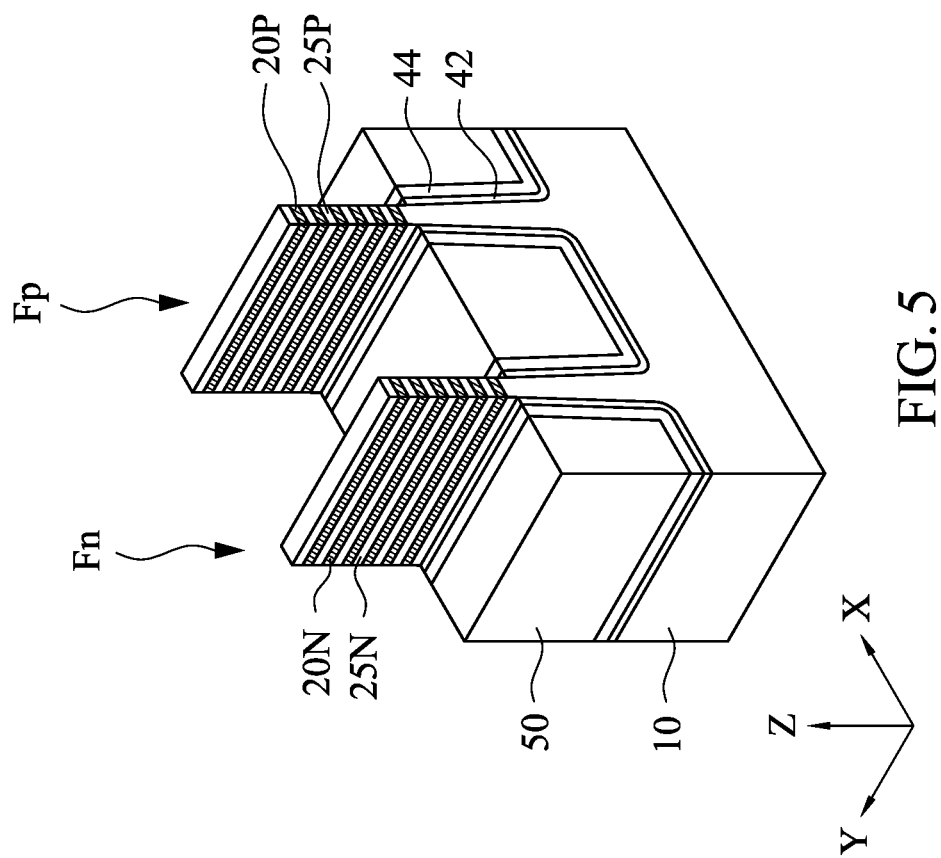
FIG. 5 shows one of various stages of sequential patterning process of the isolation insulating layer of a GAA FET device according to one embodiment of the present disclosure.

FIG. 5 shows one of various stages of sequential patterning process of the isolation insulating layer of a GAA FET device according to one embodiment of the present disclosure. As shown in FIG. 5, the insulating layer 50 is recessed to partially expose a part of the fin structures. The exposed fin structures Fp and Fn both include the stacked structure of the first semiconductor layer 20P and 20N and the second semiconductor layers 25P and 25N. As shown in FIG. 5, the bottommost first semiconductor layer is fully exposed from the isolation insulating layer 50. In other embodiments, the bottommost first semiconductor layer is partially embedded in the isolation insulating layer 50.

Figure 6:
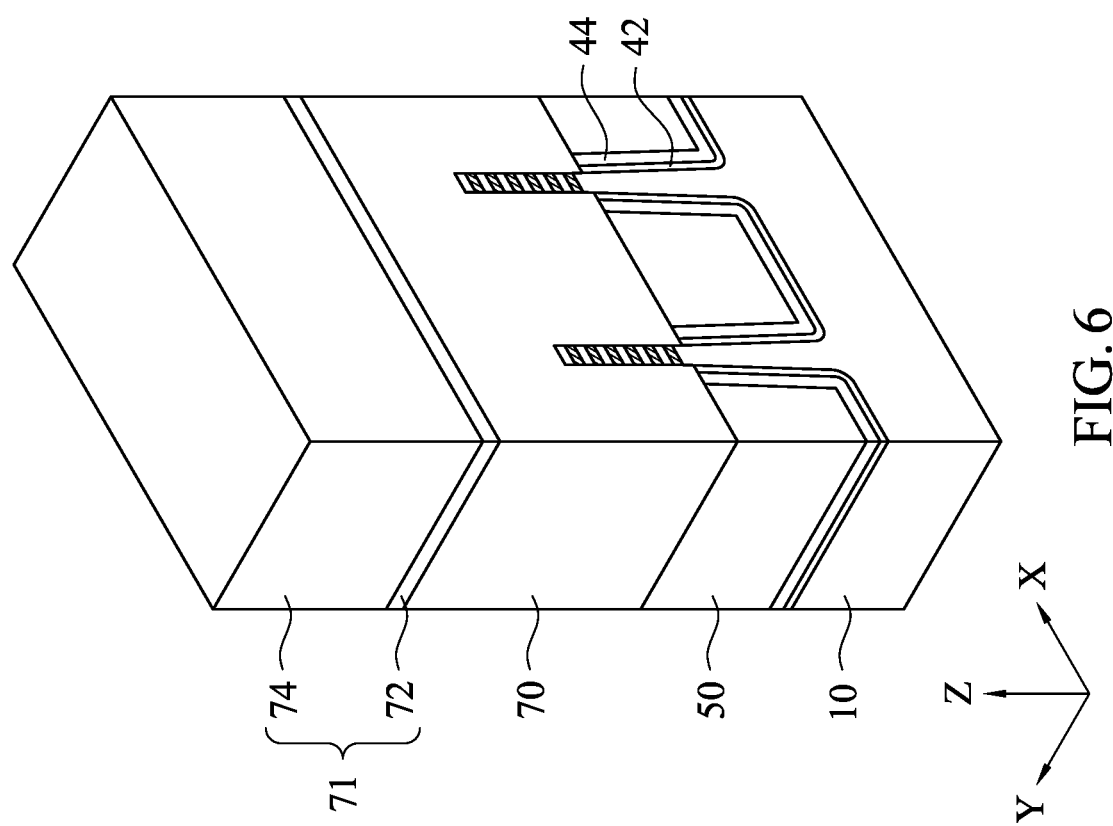
FIG. 6 shows one of various stages of sequential manufacturing process for forming a sacrificial gate structure of a GAA FET device according to one embodiment of the present disclosure.

FIG. 6 shows one of various stages of sequential manufacturing process for forming a sacrificial gate structure of a GAA FET device according to one embodiment of the present disclosure. After the upper portions (stacked layer portions) of the fin structures Fp and Fn are exposed, sacrificial gate structures are formed over the exposed fin structures, as shown in FIG. 6.

The sacrificial gate structures are formed by first blanket depositing a sacrificial gate dielectric layer over the fin structures. The sacrificial gate dielectric layer includes one or more layers of silicon oxide, silicon nitride or silicon oxynitride. The thickness of the sacrificial gate dielectric layer is in a range from about 1 nm to about 5 nm in some embodiments. A sacrificial gate electrode layer 70 is then blanket deposited on the sacrificial gate dielectric layer and over the fin structures, such that the fin structures are fully embedded in the sacrificial gate electrode layer 70. The sacrificial gate electrode layer includes silicon such as poly crystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process.

Subsequently, a mask layer 71 is formed over the sacrificial gate electrode layer 70, as shown in FIG. 6. The mask layer 71 includes a pad SiN layer 72 and a silicon oxide mask layer 74 in some embodiments.

Figure 7:
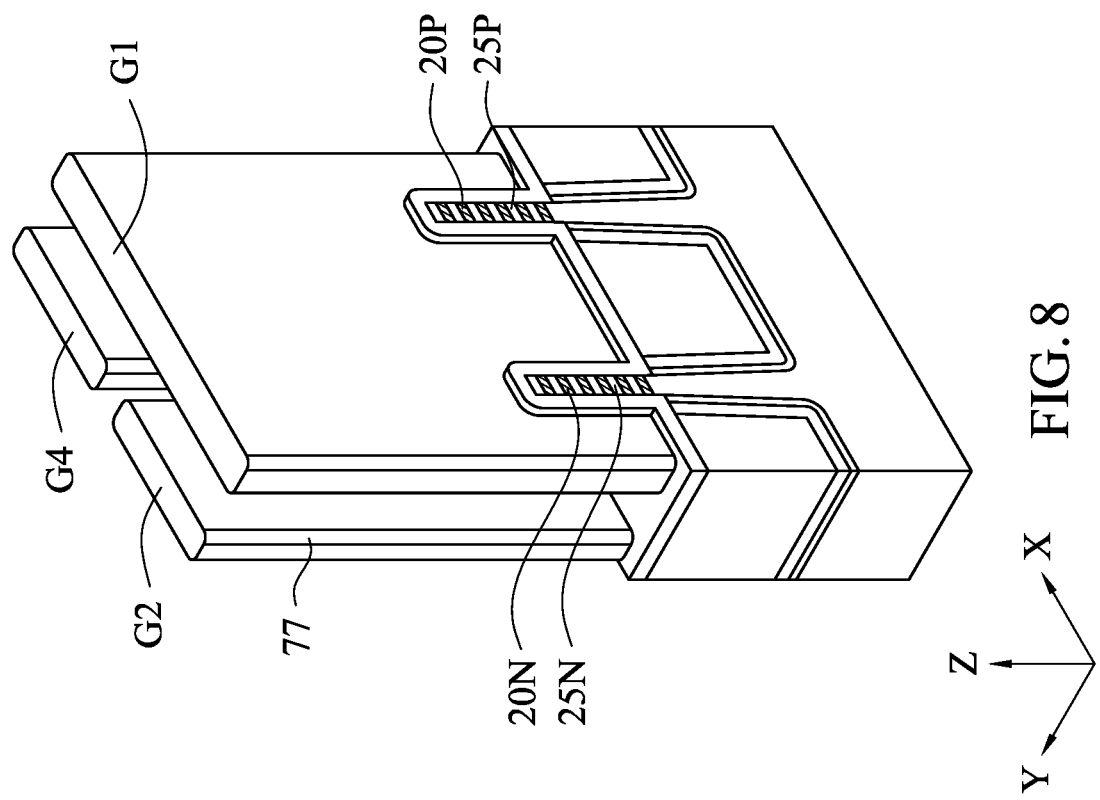
FIG. 7 shows one of various stages of sequential manufacturing process for patterning sacrificial gate structures of a GAA FET device according to one embodiment of the present disclosure.

FIG. 7 shows one of various stages of sequential manufacturing process for patterning sacrificial gate structures of a GAA FET device according to one embodiment of the present disclosure. As shown in FIG. 7, a patterning operation is performed on the mask layer 71 and sacrificial gate electrode layer is patterned into the sacrificial gate structures G1-G5, as shown in FIG. 7. FIG. 7 illustrates the structure after a sacrificial gate structures are formed over the exposed fin structures. The sacrificial gate structures are formed over a portion of the fin structure which is to be a channel region. The sacrificial gate structures define the channel region of the GAA FET. Further, by patterning the sacrificial gate structure, the stacked layers of the first and second semiconductor layers are partially exposed on opposite sides of the sacrificial gate structure, as source/drain (S/D) regions. In this disclosure, a source and a drain are interchangeably used and the structures thereof are substantially the same.

In one embodiment shown in FIG. 7, the sacrificial gate structure G1 is formed over the fin structures Fp and Fn, while the sacrificial gate structures G2 and G3 are formed over only the fin structure Fp and the sacrificial gate structures G4 and G5 are formed over only the fin structure Fn. The configuration of the sacrificial gate structures is not limited to that of FIG. 7. The width of the sacrificial gate electrode layer 70 is in a range from about 5 nm to about 25 nm in some embodiments.

Figure 8:
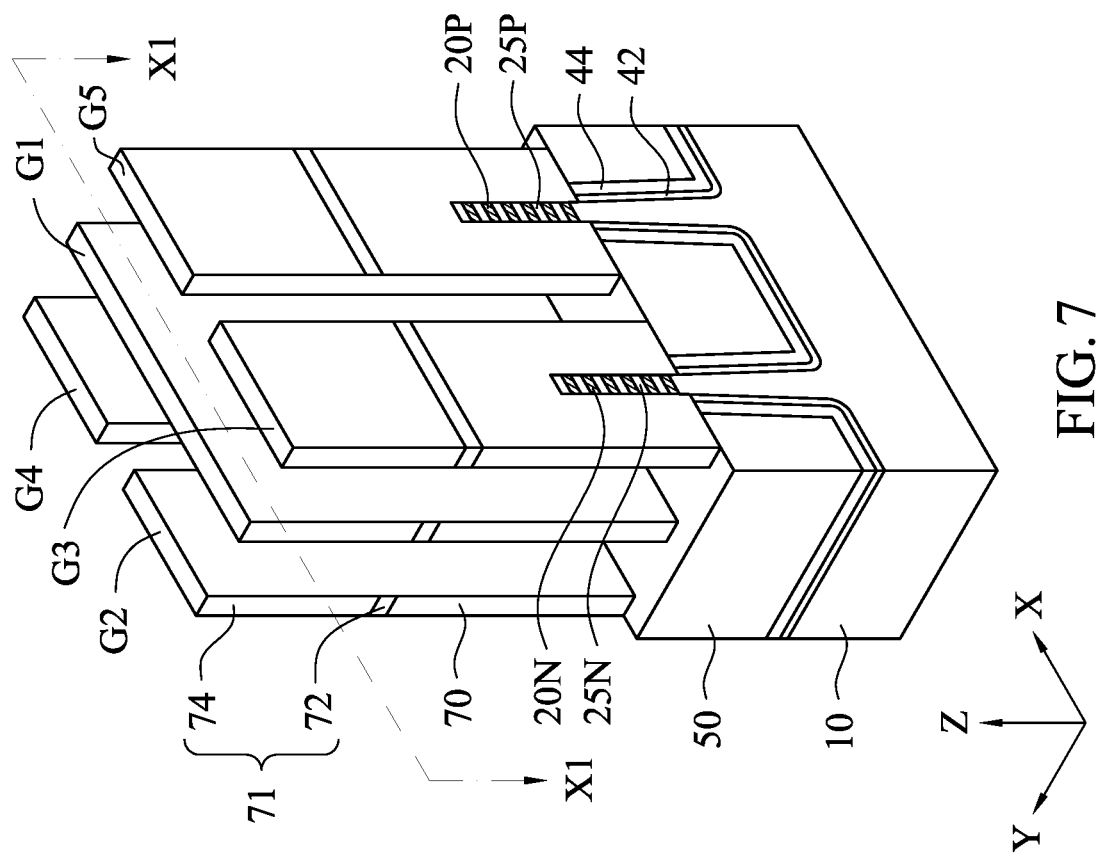
FIG. 8 shows one of various stages of sequential manufacturing process of a blanket layer over the patterned sacrificial gate structures of a GAA FET device according to one embodiment of the present disclosure.

FIG. 8 shows one of various stages of sequential manufacturing process of a blanket layer over the patterned sacrificial gate structures of a GAA FET device according to one embodiment of the present disclosure. As shown in FIG. 8, after the sacrificial gate structure is formed, a blanket layer 77 of an insulating material for sidewall spacers is conformally formed by using CVD or other suitable methods. FIG. 8 is a cut view corresponding to line X1-X1 of FIG. 7 (between G1 and G3, G5). The blanket layer 77 is deposited in a conformal manner so that it is formed to have substantially equal thicknesses on vertical surfaces, such as the sidewalls, horizontal surfaces, and the top of the sacrificial gate structure. In some embodiments, the blanket layer 77 is deposited to a thickness in a range from about 2 nm to about 10 nm. In one embodiment, the insulating material of the blanket layer 77 is a silicon nitride-based material, such as SiN, SiON, SiOCN or SiCN and combinations thereof.

Figure 9:
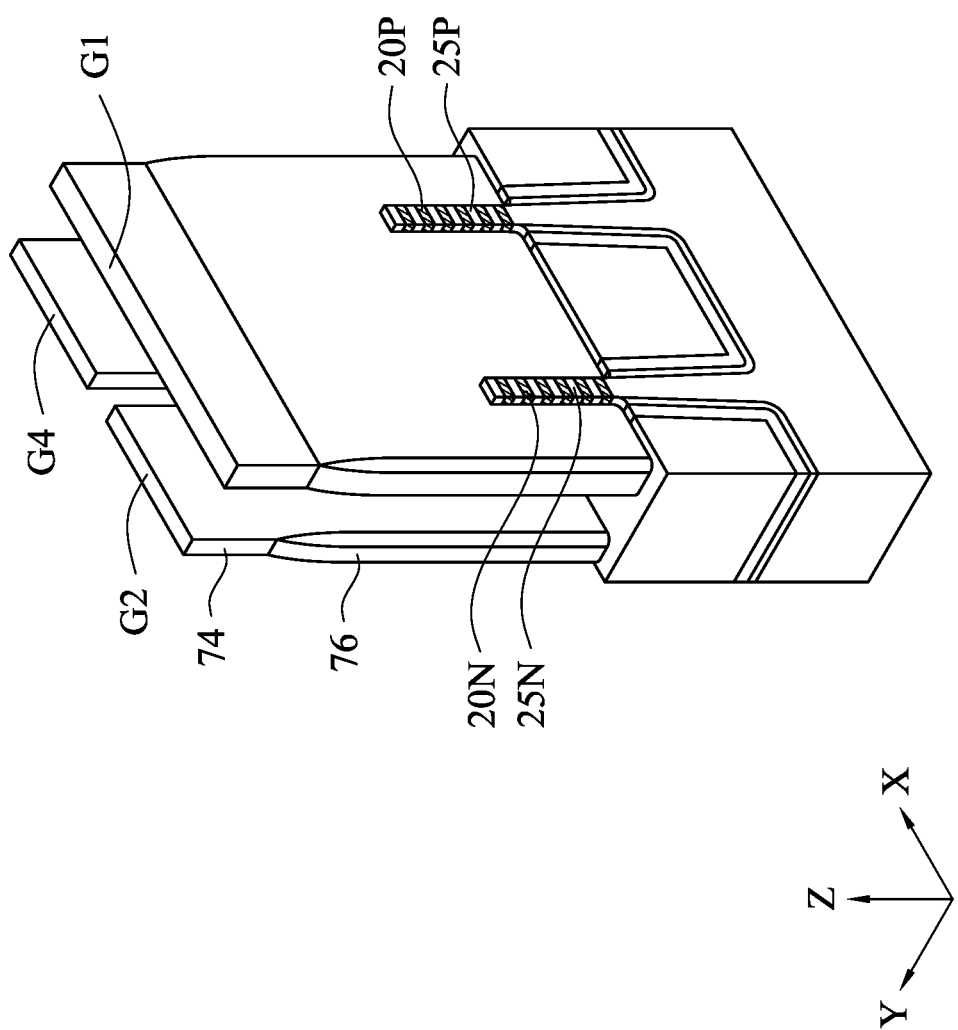
FIG. 9 shows one of various stages of sequential manufacturing process of sidewall spacers of a GAA FET device according to one embodiment of the present disclosure.

FIG. 9 shows one of various stages of sequential manufacturing process of sidewall spacers of a GAA FET device according to one embodiment of the present disclosure. As shown in FIG. 9, side wall spacers 76 are formed on opposite sidewalls of the sacrificial gate structures. After the blanket layer 77 is formed, anisotropic etching is performed on the blanket layer 77 using, for example, reactive ion etching (RIE). During the anisotropic etching process, most of the insulating material is removed from horizontal surfaces, leaving the dielectric spacer layer on the vertical surfaces such as the sidewalls of the sacrificial gate structures and the sidewalls of the exposed fin structures. The mask layer 74 may be exposed from the sidewall spacers. In some embodiments, isotropic etching is subsequently performed to remove the insulating material from the sidewalls of the exposed fin structures Fn and Fp, as shown in FIG. 9. In other embodiments, the insulating material on the sidewalls of the fin structures is partially removed. In some embodiments, the isotropic etch is a wet etch process. After the sidewall spacers 76 are formed, the space between G1 and G2, G2 or G1 and G4, G5 is in a range from about 5 nm to about 25 nm in some embodiments.

Figure 10:
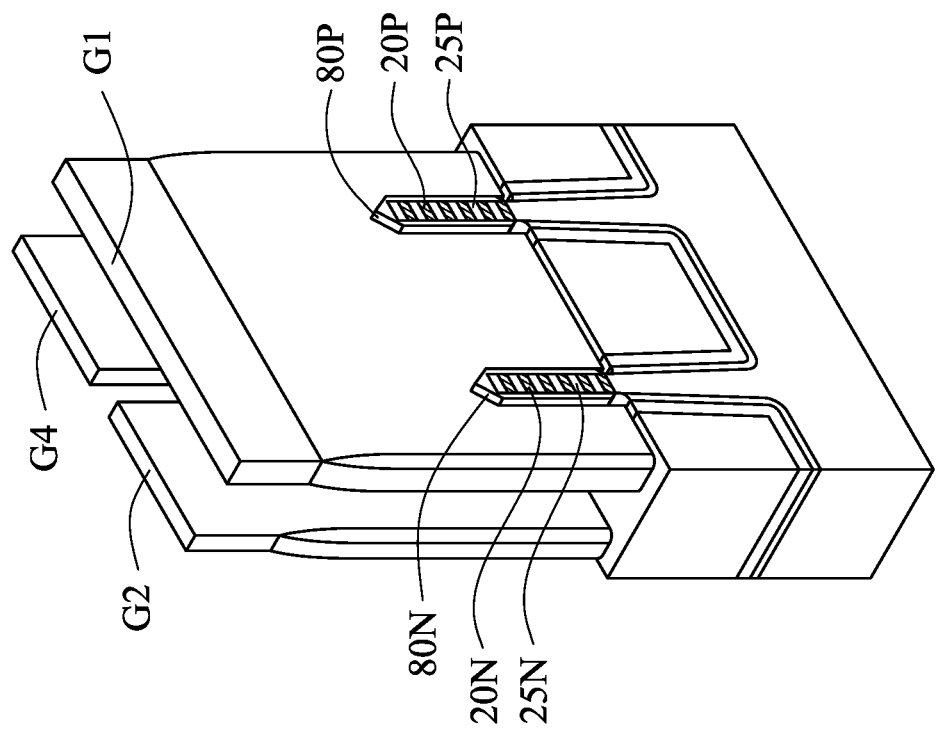
FIG. 10 shows one of various stages of sequential manufacturing process of an epitaxial layer in source/drain (S/D) regions of a GAA FET device according to one embodiment of the present disclosure.

FIG. 10 shows one of various stages of sequential manufacturing process of an epitaxial layer in source/drain (S/D) regions of a GAA FET device according to one embodiment of the present disclosure. As shown in FIG. 10, the S/D epitaxial layers 80P and 80N wraps around the fin structures Fp and Fn in the S/D region. The epitaxial layers 80P and 80N include one or more of SiGe and Ge. In one or more embodiments, the S/D epitaxial layers include one or more of SiC, SiP and SiCP formed by using an epitaxial growth process. The S/D epitaxial layers 80P and 80N are formed by an epitaxial growth method using CVD, ALD or molecular beam epitaxy (MBE).

Figure 11:
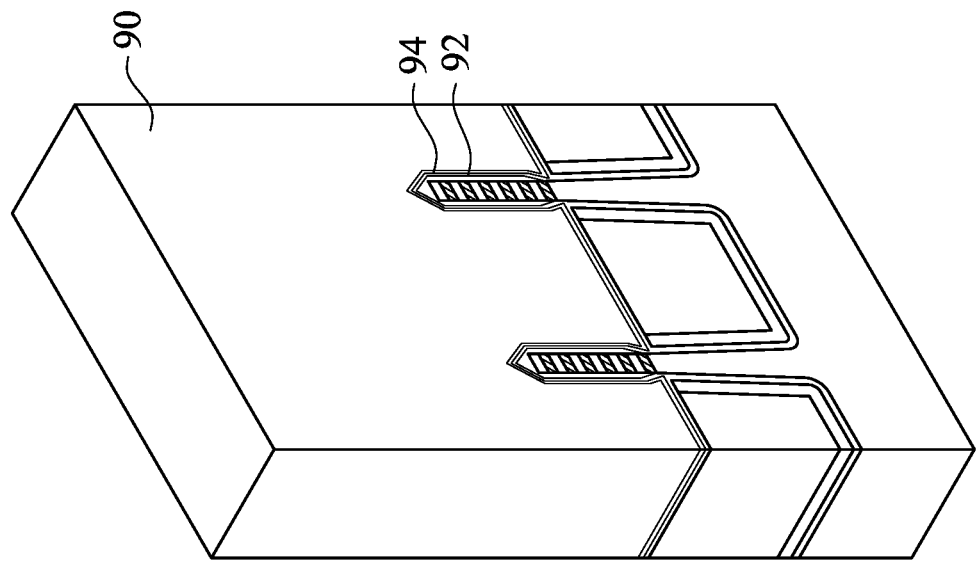
FIG. 11 shows one of various stages of sequential manufacturing process of covering a GAA FET device with an insulating layer according to embodiments of the present disclosure.

FIG. 11 shows one of various stages of a sequential manufacturing process of covering a GAA FET device with an insulating layer according to embodiments of the present disclosure. In some embodiments, the insulating layer is an interlayer dielectric (ILD) layer 90. The materials for the ILD layer 90 may include compounds comprising Si, O, C and/or H, such as SiCOH and SiOC. Organic material, such as polymers, may be used for the ILD layer 90. Further, in some embodiments, before forming the ILD layer 90, a silicon oxide layer 92 is formed over the GAA FET device, and further a SiN layer 94 may be formed over the oxide layer. A SiN layer may also be formed over the ILD layer 90 to protect the ILD layer from being etched during subsequent etching of sacrificial gate dielectric layer.

Figure 12:
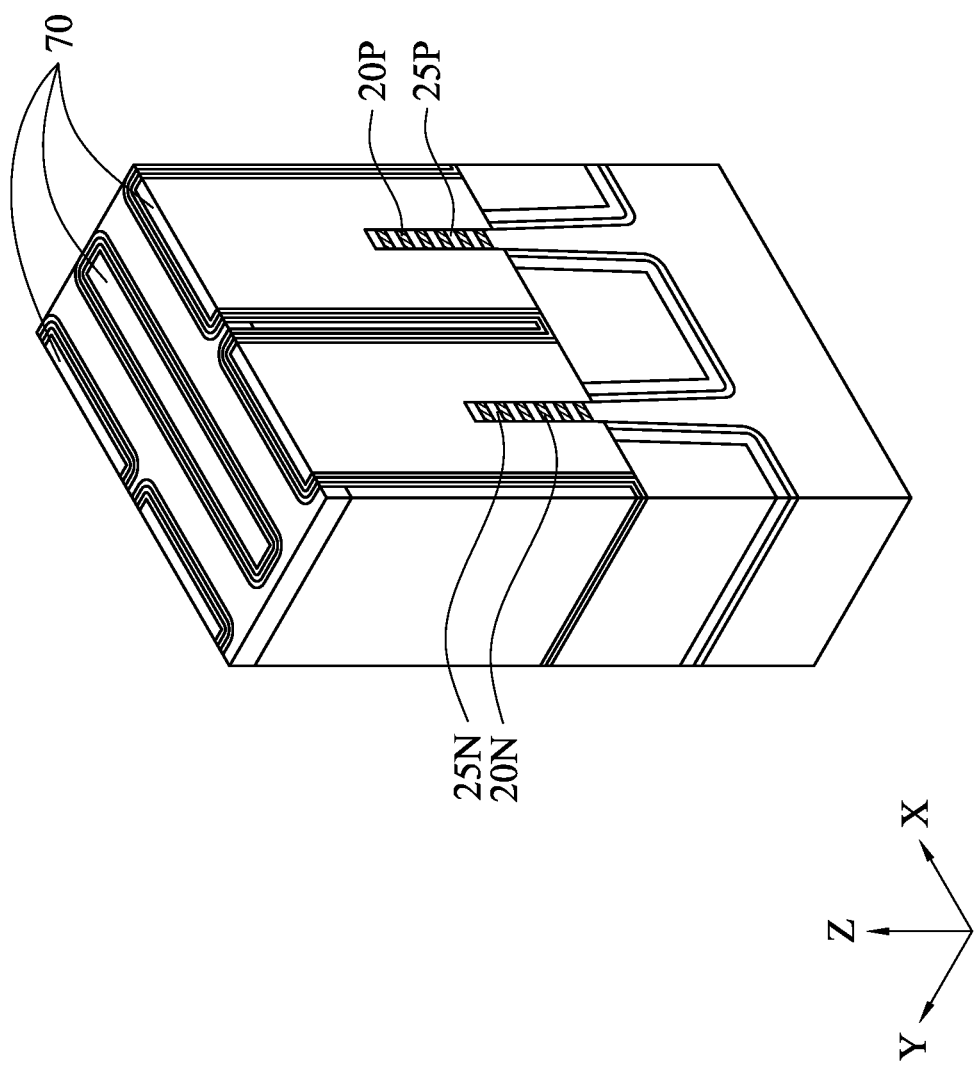
FIG. 12 shows one of various X-Z cross sectional views showing the fin structure in the S/D regions of a GAA FET device according to one embodiment of the present disclosure.

FIG. 12 shows one of various X-Z cross sectional views showing the fin structure in the S/D regions of a GAA FET device according to one embodiment of the present disclosure. The fin structures Fp and Fn in the S/D region are formed of corresponding first and second semiconductors layers 20P, 25P, 20N, and 25N. The fin structures Fp and Fn in the channel region are surrounded by the sacrificial gate electrode layer 70, which is removed in the next process stage.

Figure 13:
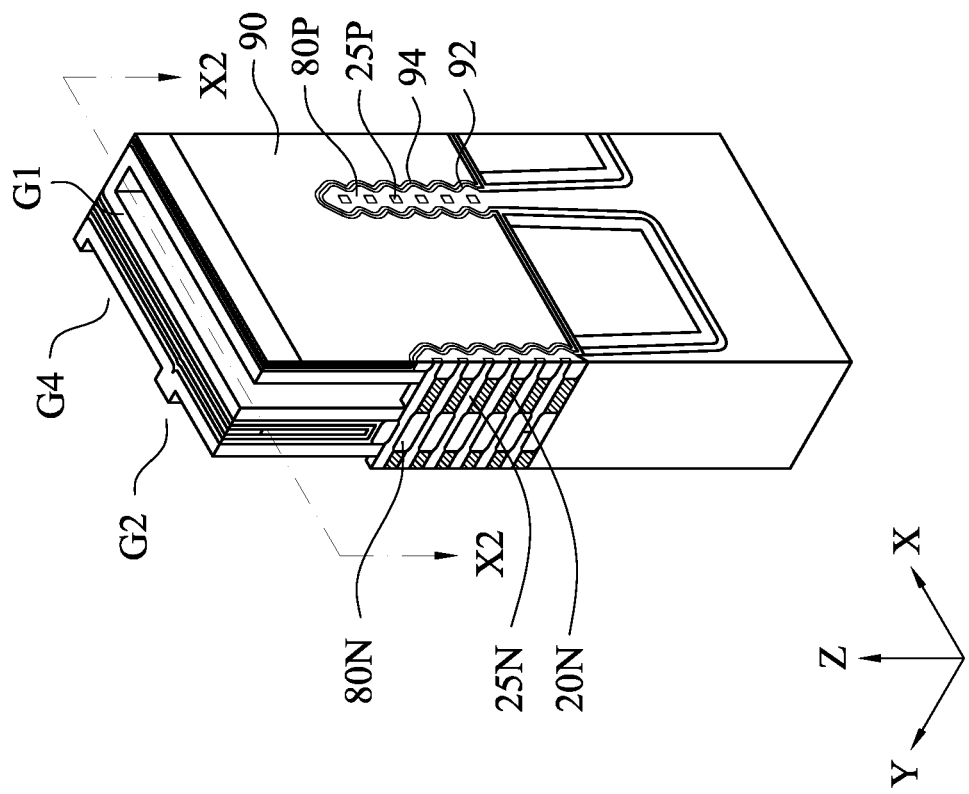
FIG. 13 shows one of various stages of sequential manufacturing process for removing of the sacrificial gate structure of a GAA FET device according to one embodiment of the present disclosure.

FIG. 13 shows one of various stages of sequential manufacturing process for removing of the sacrificial gate structure of a GAA FET device according to one embodiment of the present disclosure. As shown in FIG. 13, the sacrificial gate electrodes 70 and sacrificial gate dielectric layers 75 are removed, thereby exposing the fin structures Fp and Fn, which subsequently become channel layers of the GAA FETs. The ILD layer 90 protects the S/D structures 80P and 80N during the removal of the sacrificial gate structures. The silicon oxide layer 92 and the SiN layer 94 may be formed prior to formation of the ILD layer 90. The sacrificial gate structures can be removed using plasma dry etching and/or wet etching. When the sacrificial gate electrode 70 is polysilicon and the ILD layer 90 is silicon oxide, a wet etchant such as a TMAH solution can be used to selectively remove the sacrificial gate electrodes 70. The sacrificial gate dielectric layer 75 is thereafter removed using plasma dry etching and/or wet etching.

After the sacrificial gate structures are removed, multilayer semiconductor wires for the channel layers are formed. In some embodiments of the present disclosure, the wire structure for the n-channel layers (an n-type FET) and those for the p-channel layers (a p-type FET) are separately formed.

Figure 14:
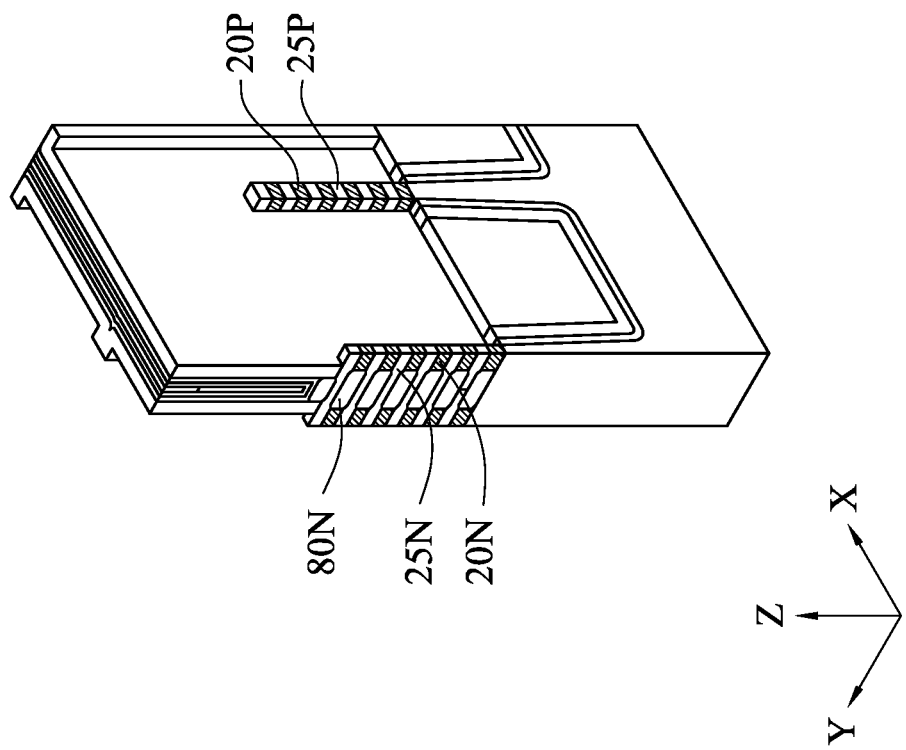
FIG. 14 shows a cross-sectional view corresponding to line X2-X2 of FIG. 14.

FIG. 14 is a cut view corresponding to line X2-X2 of FIG. 14. In the cut view shown in FIG. 14, the exposed fin structures Fp and Fn in the channel region before forming the wire structures for the for the n-channel layers and the p-channel layers are shown.

Figure 15:
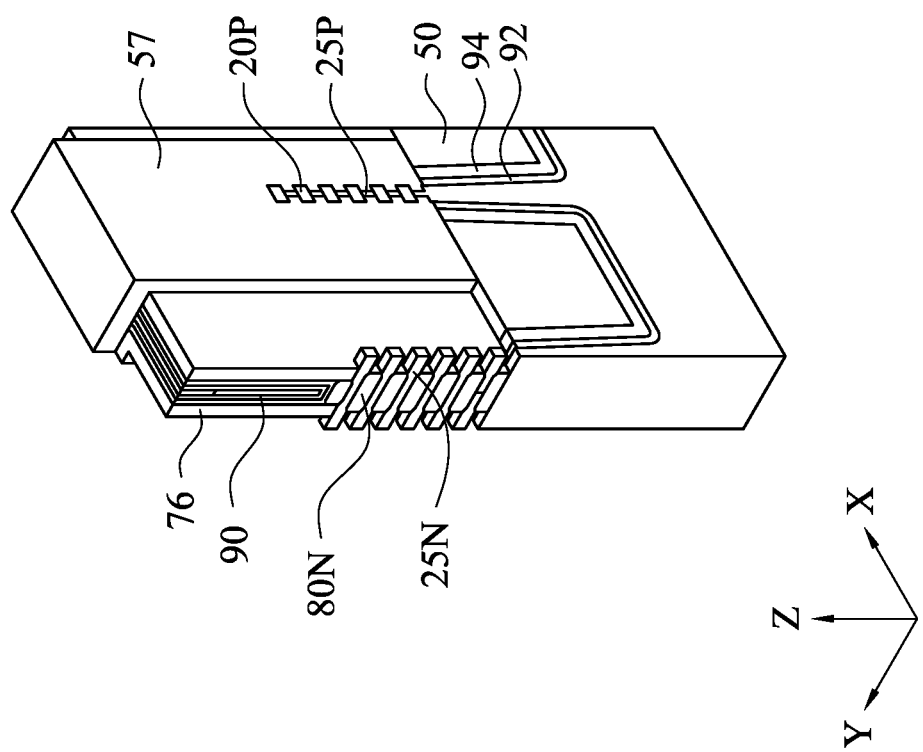
FIG. 15 shows one of various stages of sequential manufacturing process of a protective layer over a p-type region of a GAA FET device according to one embodiment of the present disclosure.

FIG. 15 shows one of various stages of sequential manufacturing process of a protective layer over a p-type region of a GAA FET device according to one embodiment of the present disclosure. As shown in FIG. 15, the p-type region is covered by a protective layer 57. Further, the first semiconductor layers 20N are removed so that the wire structures of the second semiconductor layers 25N are formed.

FIGS. 16A-16C show some of various structures before forming wire structures in an n-type FET region for a GAA FET device according to one embodiment of the present disclosure. The structures shown in FIG. 16A is before the first semiconductor layers 20N are removed. FIG. 16A shows the cross sectional view along the Y direction, FIG. 16 B shows the cross sectional view of the channel region along the X direction, and FIG. 16C shows the cross sectional view of the S/D region along the X direction.

As shown in FIGS. 16A-16C, the S/D epitaxial layer 80N is formed at the S/D region of the n-type FET under the first ILD layer 90 and the sidewall spacers 76.

Figure 17C:
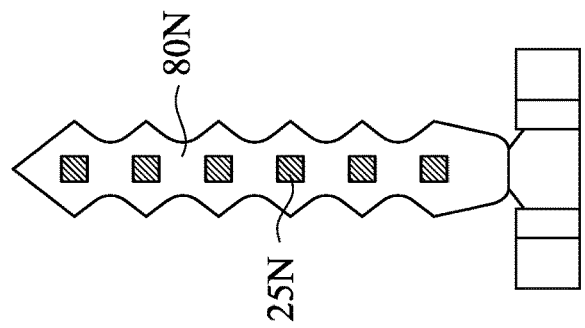
FIGS. 17A, 17B and 17C show some of various stages of sequential manufacturing processes for forming multilayer semiconductor wires in an n-type FET region for a GAA FET device according to one embodiment of the present disclosure.
Figure 17B:
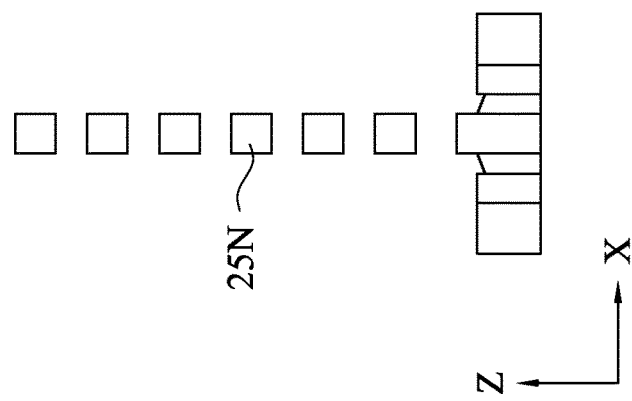
Figure 17A:
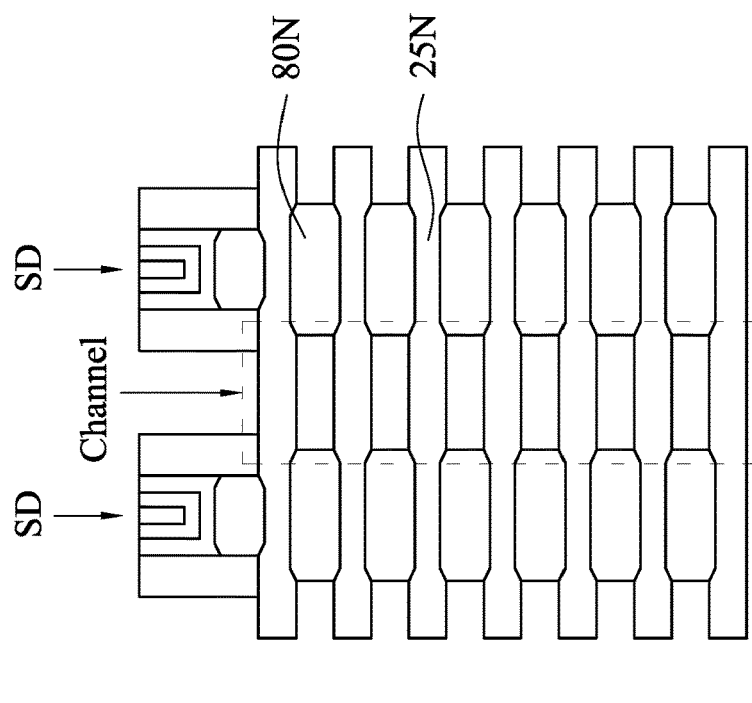

FIGS. 17A-17C some of various stages of sequential manufacturing processes for wire structures in an n-type FET region for a GAA FET device according to one embodiment of the present disclosure. FIG. 17A shows the cross sectional view along the Y direction, FIG. 17 B shows the cross sectional view of the channel region along the X direction, and FIG. 17C shows the cross sectional view of the S/D region along the X direction showing the S/D epitaxial layer 80N. The first semiconductor layers 20N are removed from the channel region by using a wet etching operation, as shown in FIGS. 17A-17B.

When the first semiconductor layers 20N are Ge or SiGe and the second semiconductor layers 25N are Si, the first semiconductor layers 20N can be selectively removed using a wet etchant such as, but not limited to ammonium hydroxide ($NH_4OH$), tetramethylammonium hydroxide (TMAH), ethylenediamine pyrocatechol (EDP), a potassium hydroxide (KOH) solution, a hydrochloric acid (HCl) solution, or a hot ammonia solution. A plasma dry etching or a chemical vapor etching may also be used.

In one embodiment of the present disclosure, the S/D epitaxial layer 80N is formed of SiP, SiC or SiCP, while the first semiconductor layers 20N are formed of SiGe. Accordingly, the etching of the first semiconductor layers 20N stops at the S/D epitaxial layer 80N. This structure can prevent from the gate electrode from contacting the S/D epitaxial layer. In some embodiments, the core regions of the wire structures are formed by the second semiconductor layers 25N by selectively removing the second semiconductor layers 20N from the channel region. In other embodiments, the core regions of the wire structures are formed by the second semiconductor layers 25N by selectively removing the first semiconductor layers 20N from the channel region.

Figure 18B:
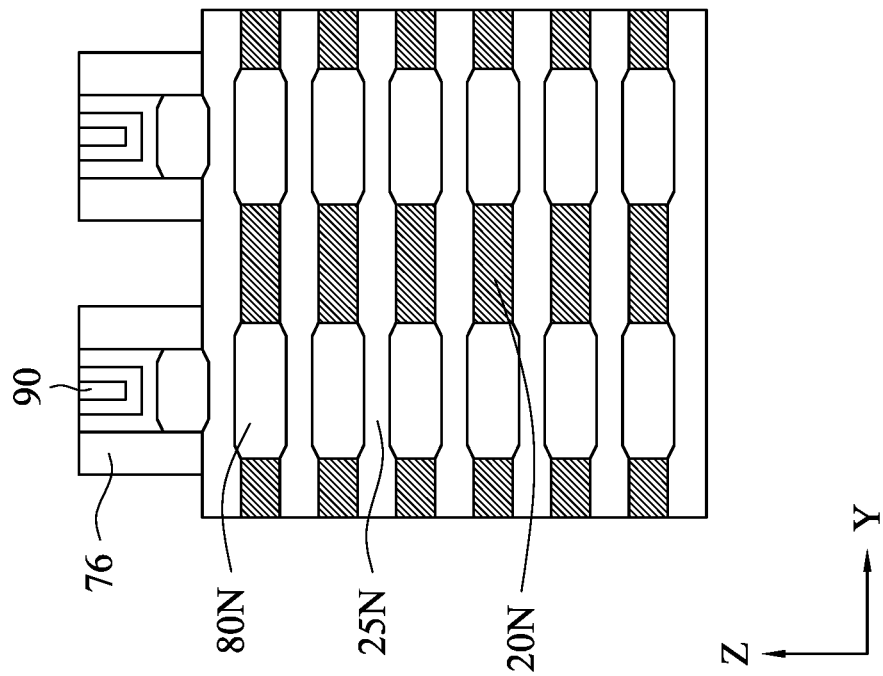
FIGS. 18A and 18B show one of various cross-sectional views of multilayer semiconductor wire channels in an n-type region of an GAA FET device according to one embodiment of the present disclosure.
Figure 18A:
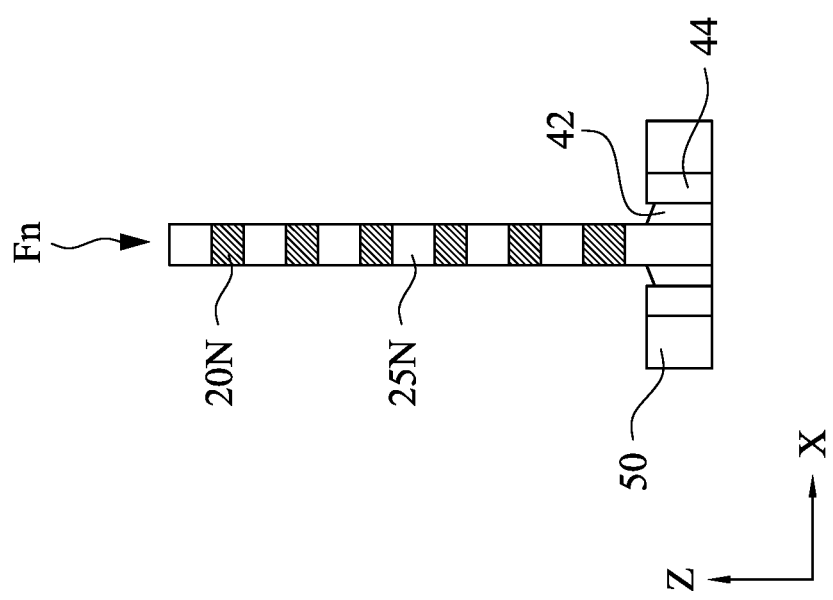

FIGS. 18A-18B show some of various cross-sectional views of multilayer semiconductor wire channels in an n-type region on GAA FET device according to one embodiment of the present disclosure. The structures depicted in FIGS. 18A and 18B are after the channel regions of the fin structure Fn is exposed. FIG. 18A shows the cross sectional view of the channel regions along the X direction, and FIG. 18B shows the cross sectional view of the fin structures along the Y direction. FIG. 18A also shows the isolation insulating layer 50, and the first liner layer 42 and the second liner layer 44. FIG. 18B also shows the sacrificial gate dielectric layer 75, the side spacer 76 and the interlayer dielectric layer 90.

Figure 19B:
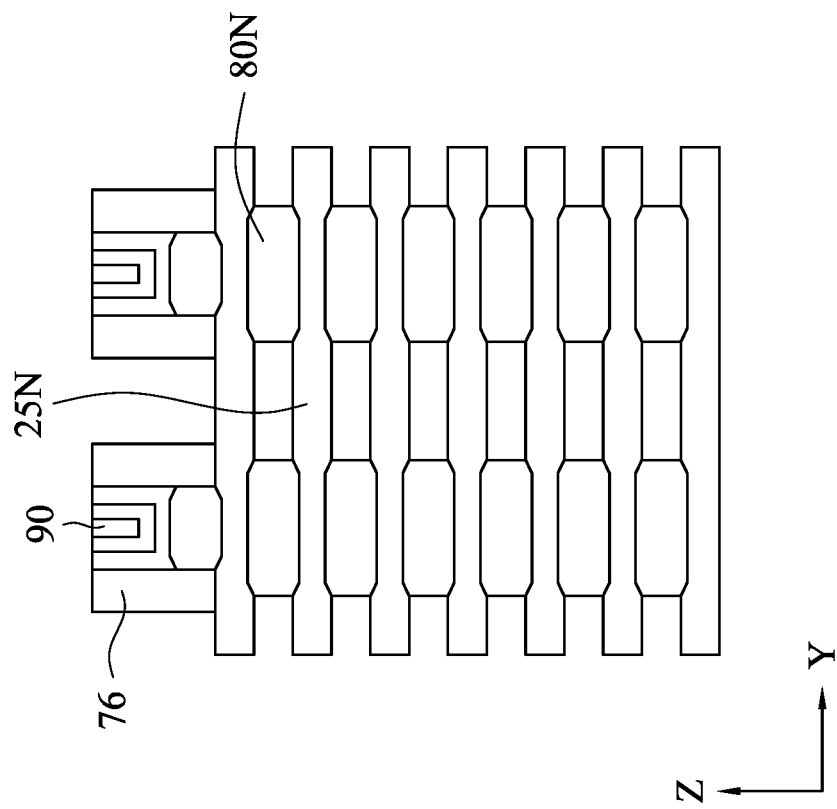
FIGS. 19A and 19B show one of various cross-sectional views of multilayer semiconductor wire channels in an n-type region of a GAA FET device after core layers are formed according to one embodiment of the present disclosure.
Figure 19A:
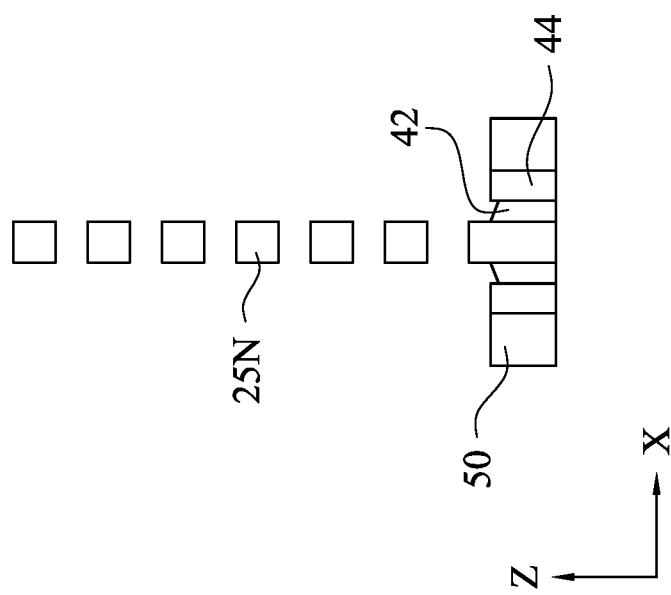

FIGS. 19A-19B show some of various cross-sectional views of multilayer semiconductor wire channels in an n-type region of a GAA FET device according to one embodiment of the present disclosure. The structures shown in FIGS. 19A and 19B are after the first semiconductor layers 20N are removed at the channel region of the fin structure Fn. At the stage of FIGS. 19A and 19B, the end portions of the second semiconductor layers 25N are located at the plane including the side face of the sidewall spacer 76. FIG. 19A shows the cross sectional view of the channel regions along the X direction, and FIG. 19B shows the cross sectional view of the fin structures along the Y direction. FIG. 19A also shows the isolation insulating layer 50, and the first liner layer 42 and the second liner layer 44. FIG. 19B also shows the side spacer 76 and the interlayer dielectric layer 90.

Figure 20B:
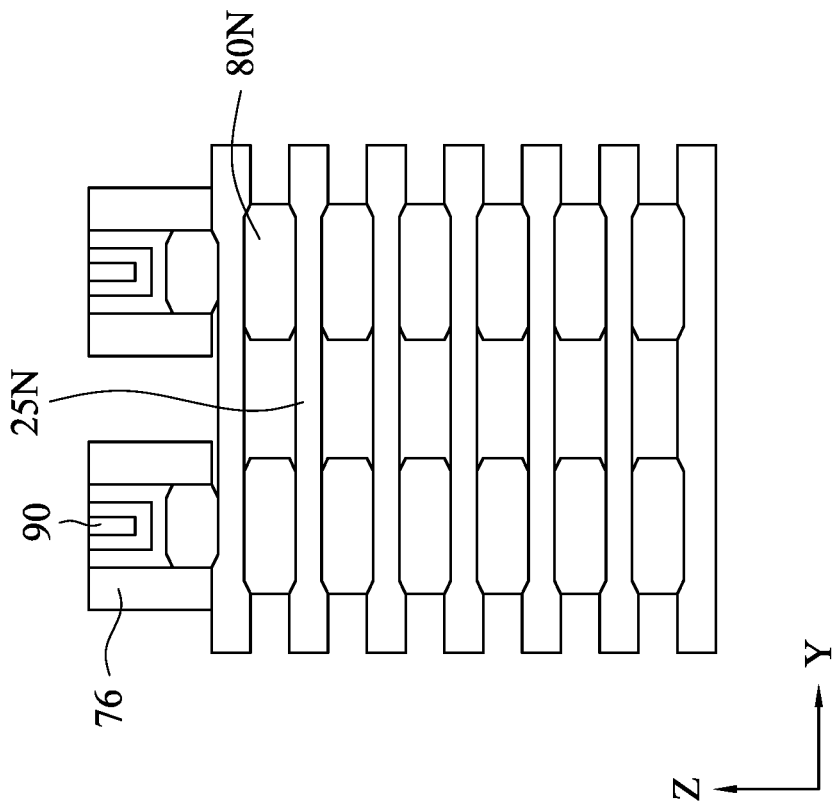
FIGS. 20A and 20B show some of various cross-sectional views of multilayer semiconductor wire channels in an n-type region of a GAA FET device after core layers are rounded according to one embodiment of the present disclosure.
Figure 20A:
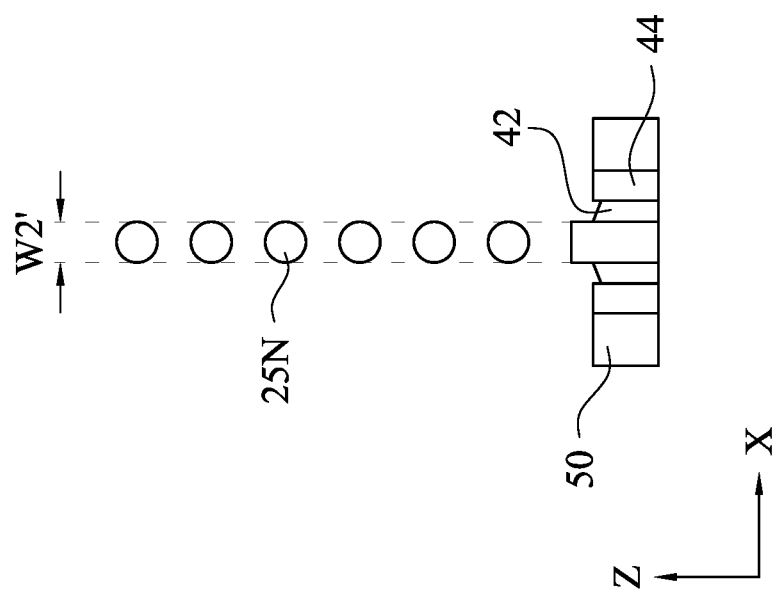

FIGS. 20A-20B show one of various cross-sectional views of multilayer semiconductor wire channels in an n-type region of a GAA FET device after core layers are rounded according to one embodiment of the present disclosure. The core layer of the multilayer semiconductor wire channels are the second semiconductor layers 25N that are rounded using a thermal anneal process, for example, at a temperature within a range of 500–700° C. and in $N_2$, $H_2$ or HCl ambient, in some embodiments. In some embodiments, the core layer of the multilayer semiconductor wire channels can be rounded by a wet etch process, by tetramethyl ammonium hydroxide (TMAH) and ammonia solutions at a temperature within a range of about 20° C.-150° C., although other solutions and temperatures may also be used. The wet etch process may result in some volume loss, which can be regrowth by an epitaxy process. The amount W2' of the remaining second semiconductor layers 25P is in a range from about 1 nm to about 10 nm in some embodiments. In an embodiment, the remaining second semiconductor layers 25P is about 1 nm to about 3 nm and form core regions of the multilayer semiconductor wires (hereinafter "wire structures") of the subject technology.

FIGS. 21A-21B show some of various cross-sectional views of channel wire structures in an n-type region of a GAA FET device after core layers and the shell layers are formed according to one embodiment of the present disclosure. The structures shown in FIGS. 21A and 21B are after the first shell layers 26N are formed over the core layers (second semiconductor layers 25N) at the channel region of the fin structure Fn to create the wire structures 33N. In some embodiments, the wire structures 33N includes more than one shell layer (not shown for simplicity), for example, a second shell layer. In some embodiments, the first shell layer 26N is made of Ge (or Si) and has a thickness with in a range of about 1-4 nm. In an embodiment, the first shell layer 26P has a thickness of about 1 nm. In some embodiments, the first shell layers 26N are epitaxially grown over the core regions 25N and have diamond shape cross sections when the core regions 25N have square shape cross sections. In some embodiments, the second shell layer is made of Si (or Ge) and has a thickness within a range of about 1-4 nm. For example, when the first shell layer 26N is made of Ge, the second shell layer is formed of Si and vice versa. In some embodiments, the wire structures 33N may partially extend in to the S/D regions.

FIG. 21A shows the cross sectional view of the channel region along the X direction, and FIG. 21B shows the cross sectional view of the fin structures along the Y direction. FIG. 21A also shows the isolation insulating layer 50, and the first liner layer 42 and the second liner layer 44. FIG. 21B also shows the sacrificial gate dielectric layer 75, the side spacer 76 and the interlayer dielectric layer 90.

Figure 22:
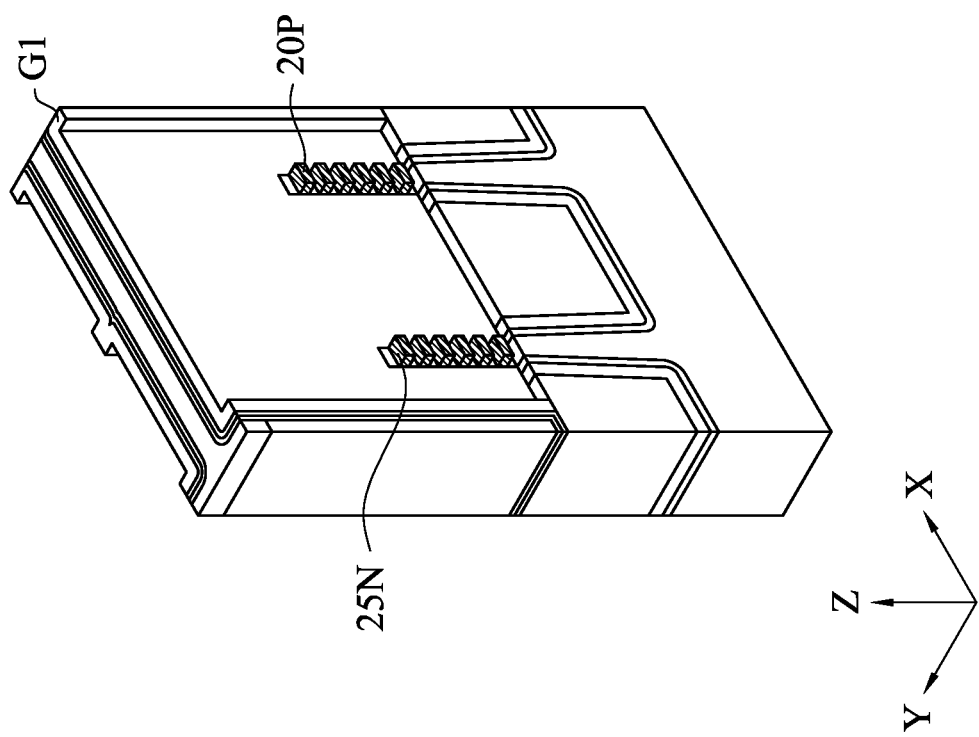
FIG. 22 shows one of various X-Z cross-sectional views after removal of first semiconductor layer 20N and the second semiconductor layer 25P in the channel region a GAA FET device according to one embodiment of the present disclosure.

FIG. 22 shows one of various X-Z cross-sectional view after removal of first semiconductor layer 20N and the second semiconductor layer 25P in the channel region a GAA FET device according to one embodiment of the present disclosure. The shell layers of the wire structures are formed over the core layers 20P and 25N.

Figure 23:
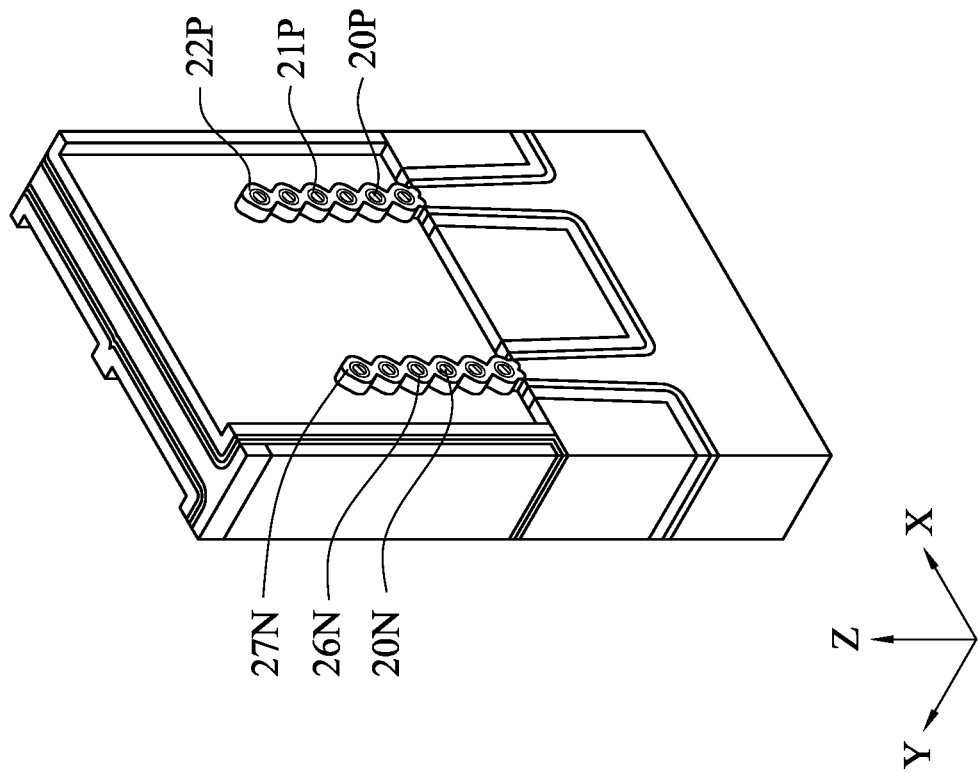
FIG. 23 shows some of various manufacturing processes of a shell layer according to one embodiment of the present disclosure.

FIG. 23 shows one of various manufacturing processes of a shell layer according to one embodiment of the present disclosure. The shell layers 21P and 26N are created on the core regions 20P and 25N of the PFET and NFET regions, respectively, for example by epitaxial growth process. In some embodiments, additional shell layers, for example, 22P and 27N are formed on the shell layers 21P and 26N, as discussed above with respect to FIG. 21A. In some embodiments, the core region is first annealed, for example, by an anneal process such as thermal anneal as discussed above to shrink the core regions before formation of the shell layers.

Figure 24:
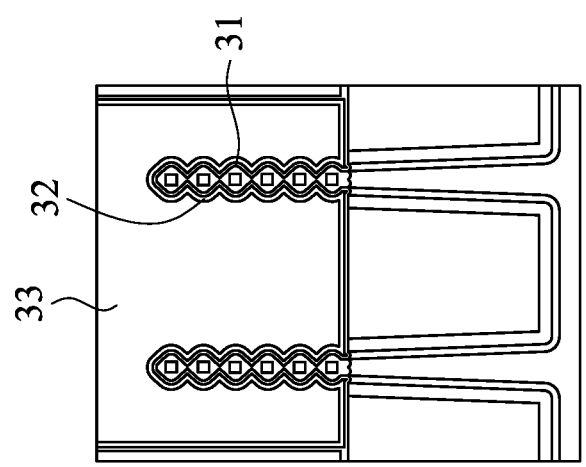
FIG. 24 shows one of various X-Z cross-sectional views through the gate structure according to one embodiment of the present disclosure.

FIG. 24 shows one of various X-Z cross-sectional view through the gate structure according to one embodiment of the present disclosure. The gate structure includes an interfacial dielectric layer 31, a high-k (HK) dielectric layer 32 and metal gate electrode 33 formed on the wire structures in the channel region. In some embodiments, the interfacial dielectric layer 31 includes silicon oxide layer. In certain embodiments, the high-k dielectric layer 32 includes one or more layers of a dielectric material, such as, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

The high-k dielectric layer 32 may be formed from CVD, ALD or any suitable method. In one embodiment, the gate dielectric layer is formed using a highly conformal deposition process such as ALD in order to ensure the formation of a gate dielectric layer having a uniform thickness around each channel layers. The thickness of the gate dielectric layer is in a range from about 1 nm to about 6 nm in one embodiment.

The gate electrode layer 33 is formed on the gate dielectric layer to surround each channel layers. The gate includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 33 may be formed from CVD, ALD, electro-plating, or other suitable method. The gate electrode layer is also deposited over the upper surface of the ILD layer 90. The gate dielectric layer and the gate electrode layer formed over the ILD layer 90 is then planarized by using, for example, CMP, until the top surface of the ILD layer 90 or the SiN layer covering it (if exists) is revealed.

In certain embodiments of the present disclosure, one or more work function adjustment layers (not shown) are interposed between the high-k dielectric layer and the gate electrode. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

Figure 25:
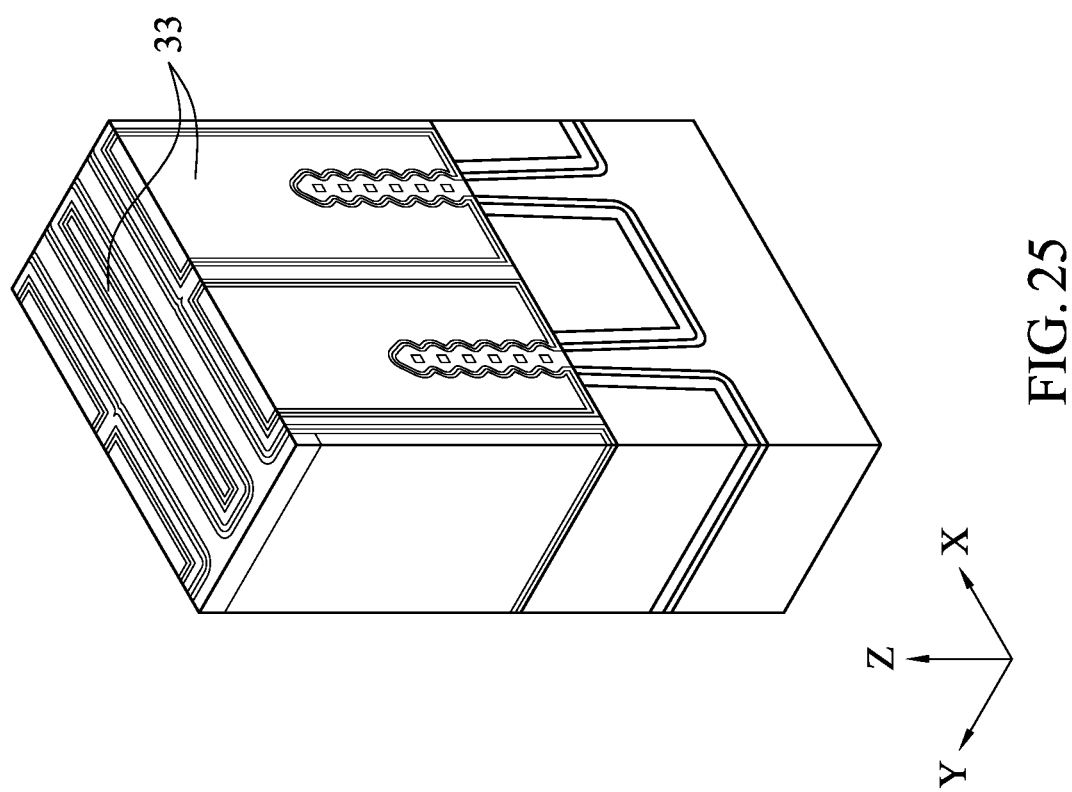
FIG. 25 shows one of various manufacturing processes of the gate structure according to one embodiment of the present disclosure.

FIG. 25 shows one of various manufacturing processes for forming the gate structure according to one embodiment of the present disclosure. The gate structure described with regard to the X-Z cross-sectional view of FIG. 24 is formed for the gates G1, G2 and G4 (see FIG. 13). FIG. 25 shows an X-Z cross section view of the gates G2 and G4.

Figure 26:
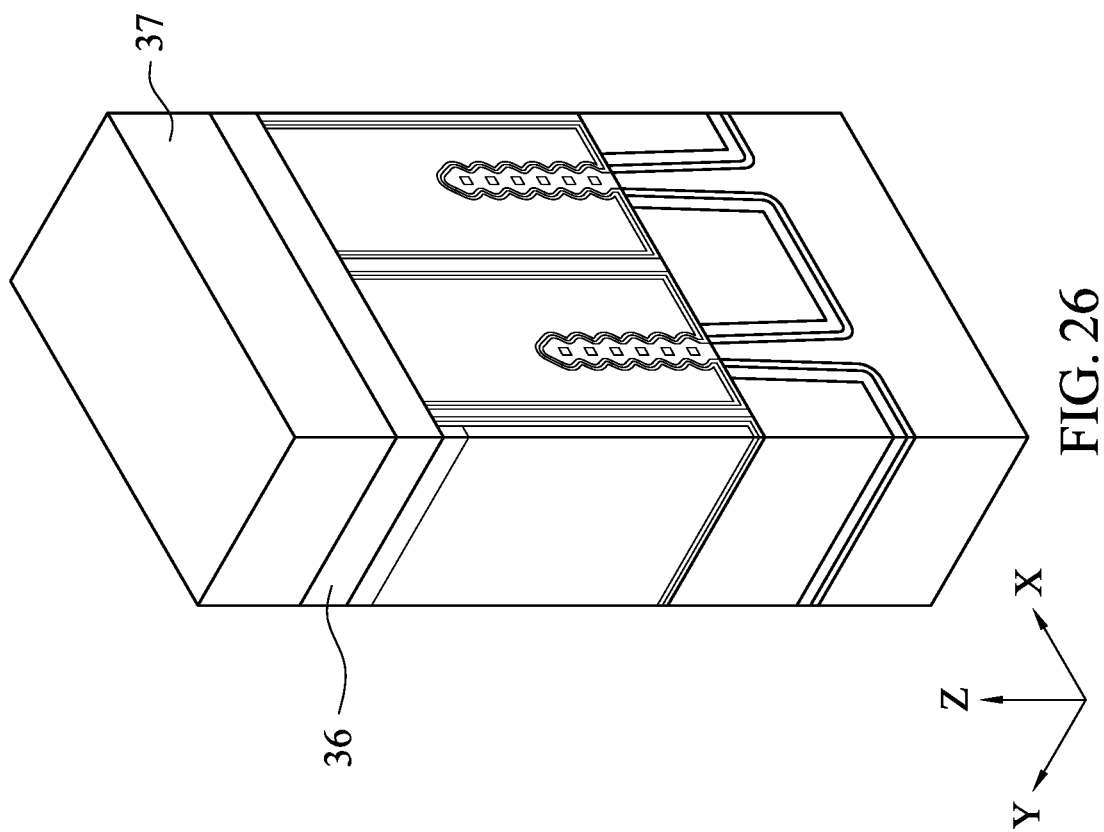
FIG. 26 shows one of various manufacturing processes of an MESL layer and an interlayer dielectric (ILD) layer according to one embodiment of the present disclosure.

FIG. 26 shows one of various manufacturing processes of an MESL layer and an interlayer dielectric (ILD) layer according to one embodiment of the present disclosure. After formation of the gate structures for gates G1, G2 and G4, an etching stop layer 36 and a first interlayer dielectric (ILD1) layer 37 are formed over the entire structure.

Figure 27:
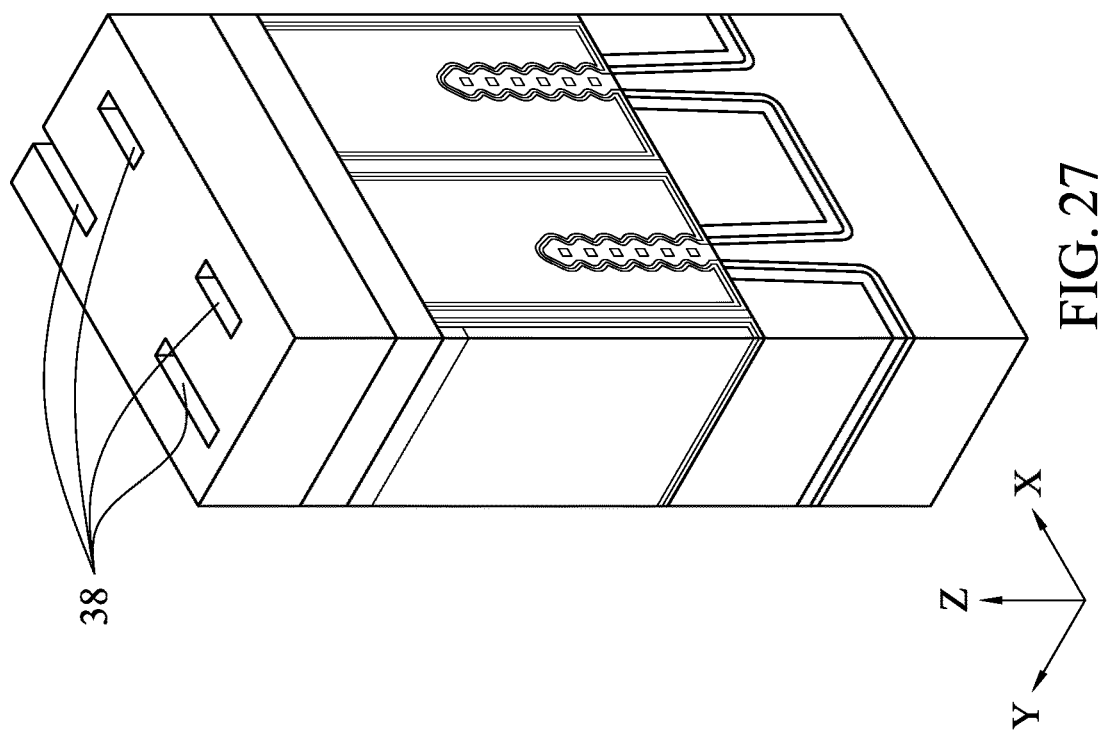
FIG. 27 shows one of various manufacturing processes of openings for contact metals according to one embodiment of the present disclosure.

FIG. 27 shows one of various manufacturing processes of openings for contact metals according to one embodiment of the present disclosure. The openings 38 are formed by a photolithography and an etch process to allow the contact metals to reach the gate metal and S/D epitaxial layers.

Figure 28:
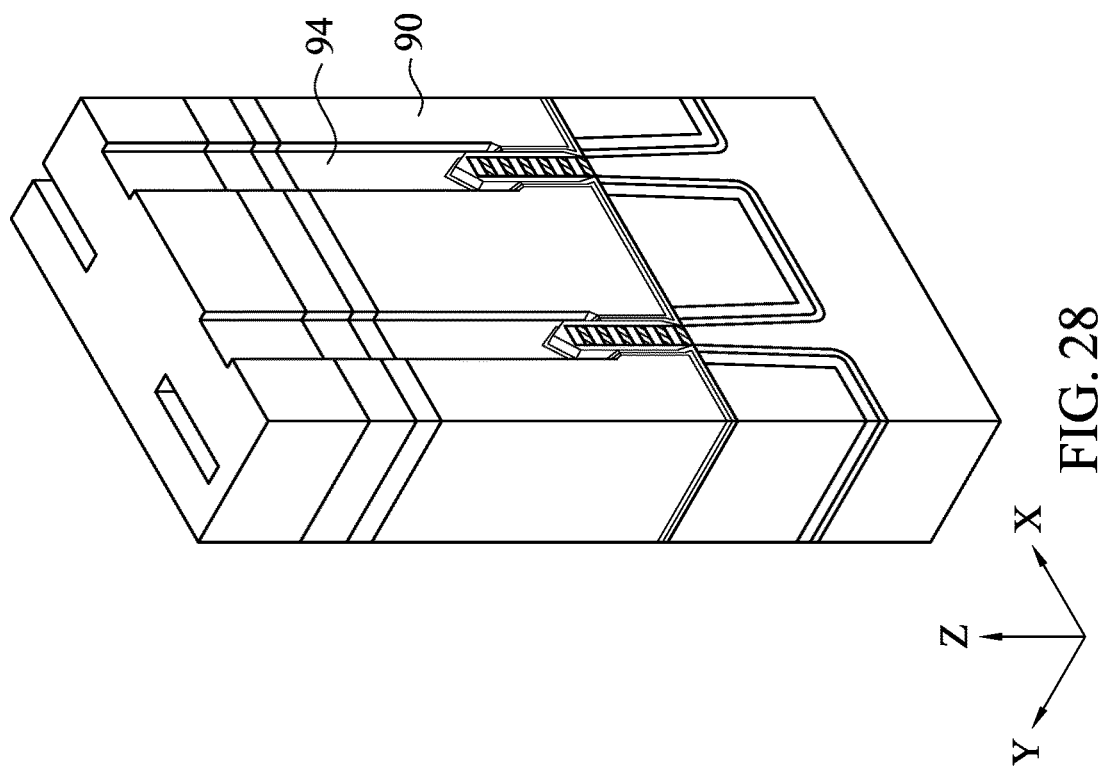
FIG. 28 shows one of various X-Z cross-sectional views through the S/D region according to one embodiment of the present disclosure.

FIG. 28 shows an X-Z cross-sectional view through the S/D region according to one embodiment of the present disclosure. FIG. 28 shows portions over the S/D regions, where the SiN layer 94 formed prior to formation of the ILD layer 90 is shown.

Figure 29:
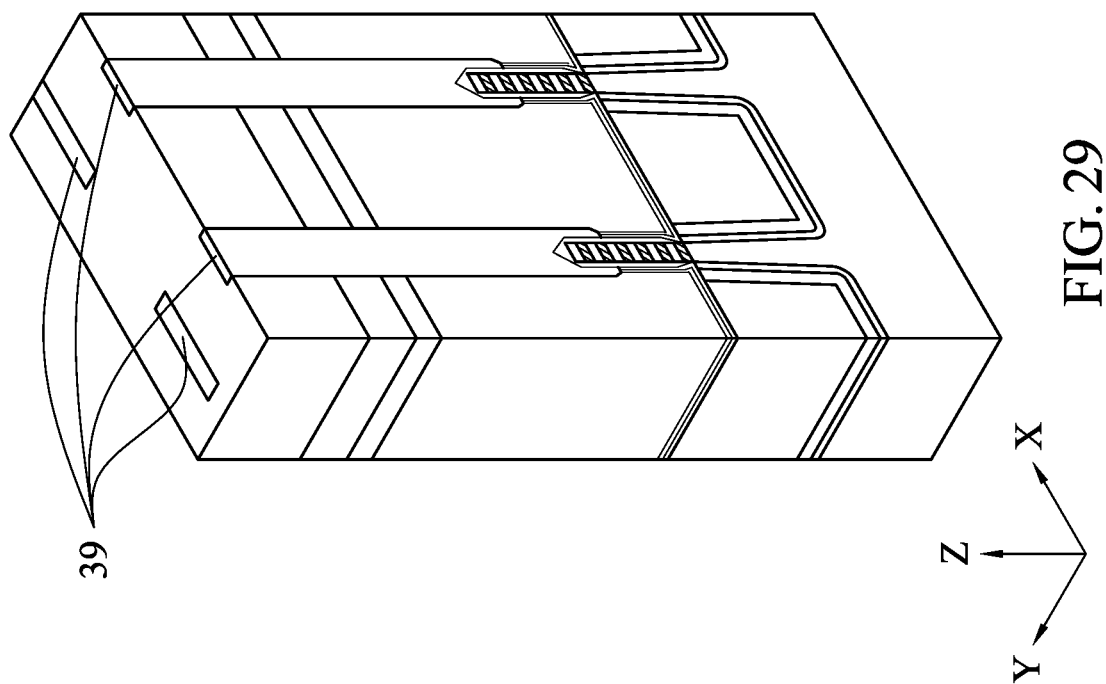
FIG. 29 shows one of various manufacturing processes of contact metals according to one embodiment of the present disclosure.

FIG. 29 shows one of various manufacturing processes of contact metals according to one embodiment of the present disclosure. The contact metals 39 for the gates and the S/D are filled through the openings formed in the process stage of FIG. 27.

Figure 30A:
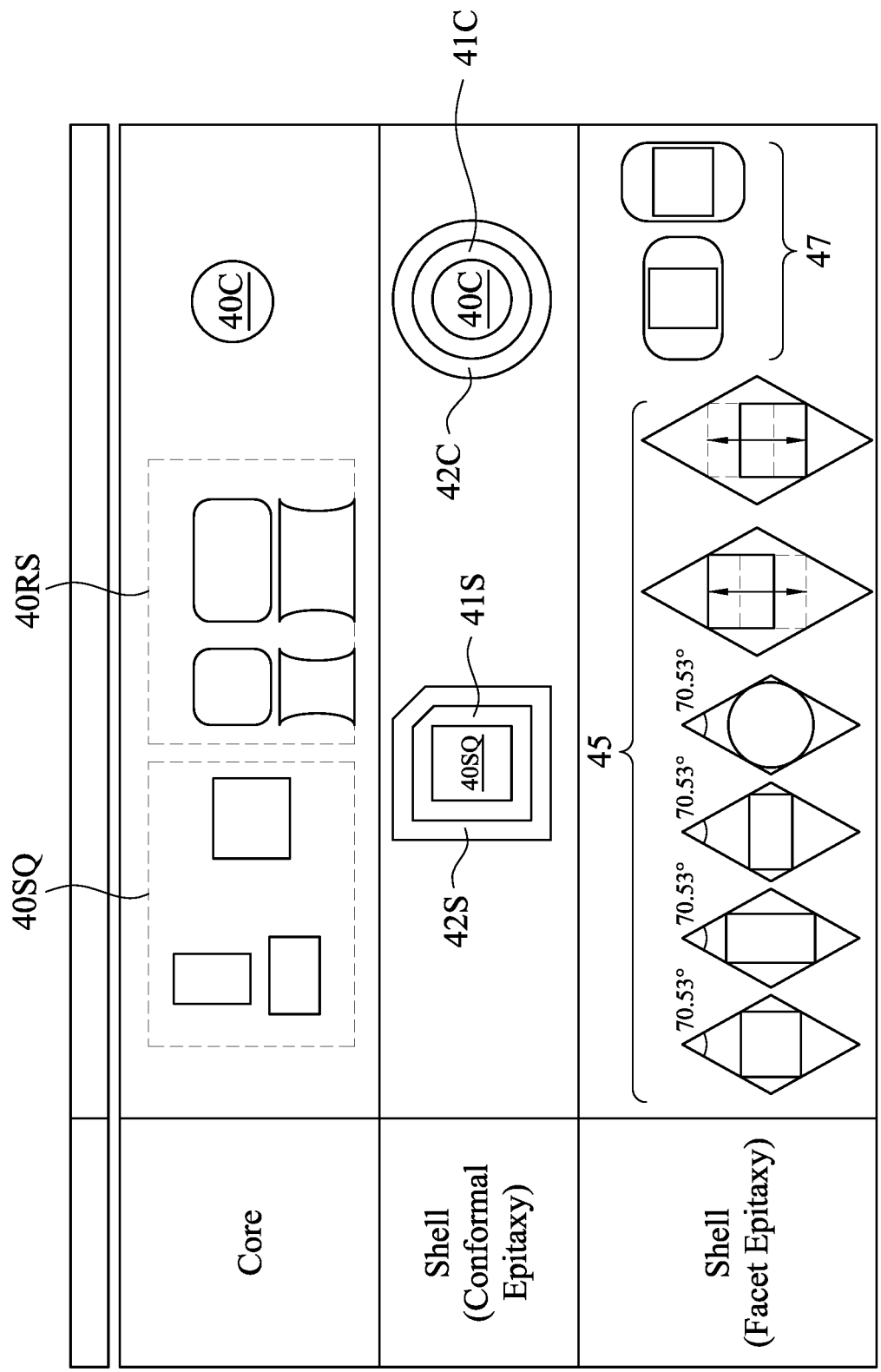
FIGS. 30A, 30B, 30C, 30D, 30E and 30F show some of various cross-sectional views of core and shell layers of multi-layer semiconductor wires of a GAA FET device according to one embodiment of the present disclosure.

FIGS. 30A-30F show some of various cross-sectional views of core and shell layers of wire structures of a GAA FET device according to various embodiments of the present disclosure. The core of the wire structures of the subject technology can take different shapes, for example, square shapes 40SQ, round square shapes 40RS, or circular shape 40C of FIG. 30A. The shapes described with respect to FIG. 30A are X-Z cross sectional views, for example, with reference coordinates shown for FIG. 15. The shape of the core of the wire structures is not limited to the ones shown in FIG. 30A and can includes other shapes such as ellipsoid, in some embodiments. The square shapes for the core may have lower level of interface traps, while being higher in roughness, compared to the round shapes. The round shapes have higher level of interface traps, but have better roughness. In some embodiments, the square shapes 40SQ include nearly square (e.g., rectangular) shapes with different orientations. In some embodiments, the rectangular shape core may have a width (Wc) within a range of about 2-15 nm and a height (Hc) within a range of about 2-8 nm, in a first orientation; and may have Wc within a range of about 2-8 nm and Hc within a range of about 2-15 nm, in a second orientation (e.g., perpendicular to the first orientation). In both orientation scenarios, the shell thickness may be within a range of about 1-5 nm. For instance, the longer side can be in the Z direction or the X direction (e.g., as shown for 25N in FIG. 19A). Further, the round square shapes 40RS can include nearly square (e.g., rectangular) shapes with rounded corners having different orientations, in some embodiments. For instance, the longer side can be in the Z direction or the X direction (e.g., as shown for 25N in FIG. 20A). In some embodiments, one or more sides of the round square shapes 40RS can be concave or convex. The dimensions of the core region of the wire structures can be within a range of about 2-5 nm, in some embodiments, and within a range of about 1-4 nm.

For square shapes 40SQ and round square shapes 40RS, the first shell layer 41S and the second shell Layer 42S can follow the shape of the core region 40SQ, in some embodiments, as shown in FIG. 30A. In some embodiments, the shape of first shell layer 41S and the second shell Layer 42S can take the shape of the core region 40SQ with some deviation, for example, having one or more flat corners, as shown in FIG. 30A. For the circular core 40C, a first shell layer 41C and a second shell Layer 42C are approximately circular, in some embodiments, although minor deviations can be expected.

For the core region having square shape (e.g., 40SQ) and circular shape (e.g., 40C) the first shell, which is grown epitaxially can be facet-selective epitaxy (facet epitaxy) as shown in group 45 and 47 of FIG. 30A. The facet epitaxy shapes 45 include rhombus (e.g., diamond) shape, such as long diamond shapes (e.g., with a smaller angle within a range of about 68-73 degrees, such as approximately 70 degrees) of the first shells that can be concentric with the core region or have their centers offset from the core region center, for example, in the Z direction. The facet epitaxy shapes 47 can be rounded rectangle, with longer side along the X or Z direction.

Figure 30B:
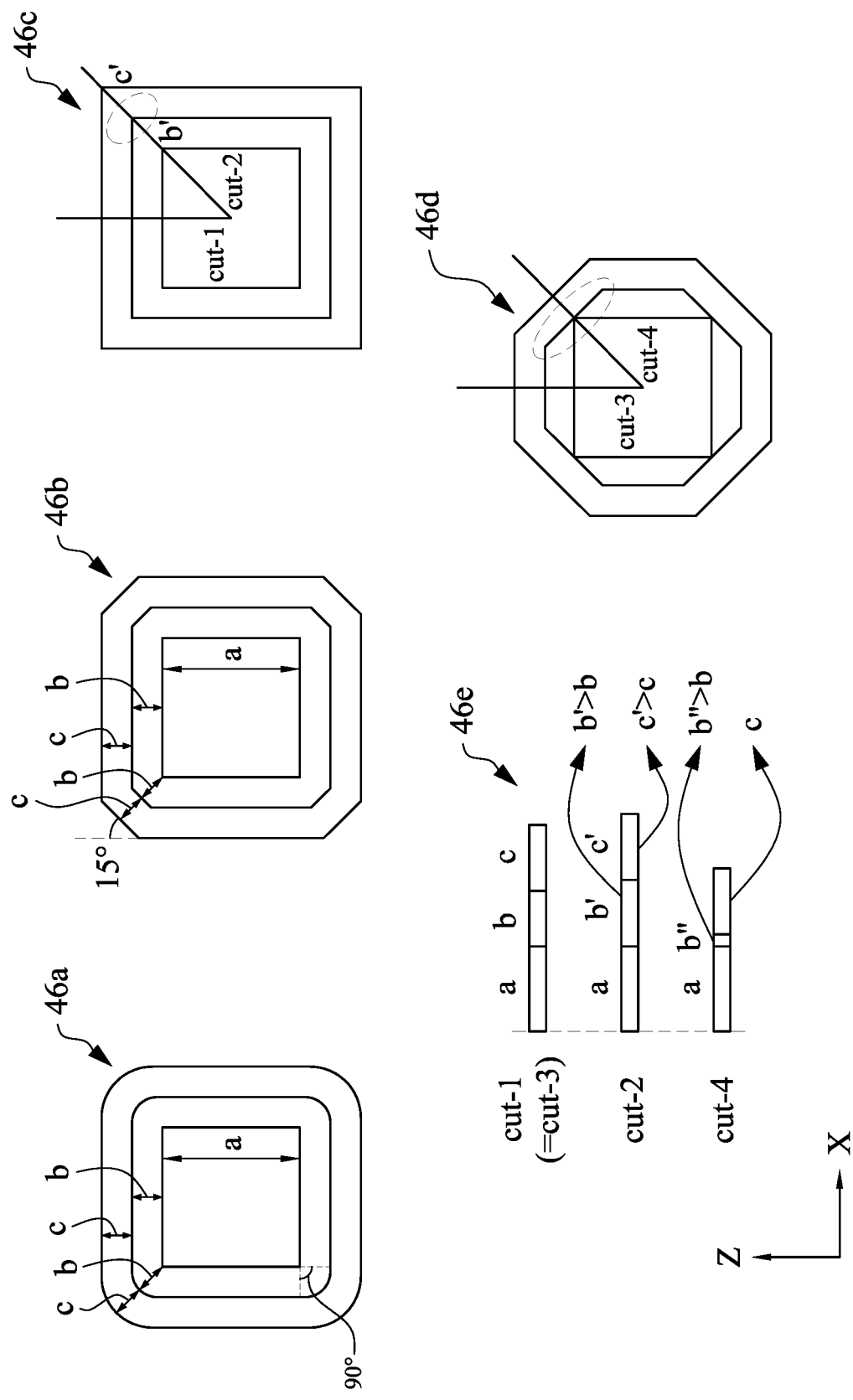

FIG. 30B shows X-Z cross sectional views 46a, 46b, 46c, and 46d of the wire structures. Relative values of dimensional parameters a, b, c, and d across different cuts of the cross-sectional view 46c (cut-1 and cut-2) and the cross-sectional view 46d (cut-3 and cut-4) are shown in the bar chart 46e. As shown in the bar chart 46e, in the cut-1 or cut-3, a s larger than c, which is larger than b. In some embodiments, b can be equal or larger than c. For the cut-2, a is the same as in cut-1, but b' and c' can be larger than b and c, respectively, in some embodiments. For the cut-4, a and c is the same as in cut-1, but b" can be smaller than b, in some embodiments. In other embodiments, the relation between parameters of cut-2 and cut-2 and cut-1 can be different from described above.

Figure 30C:
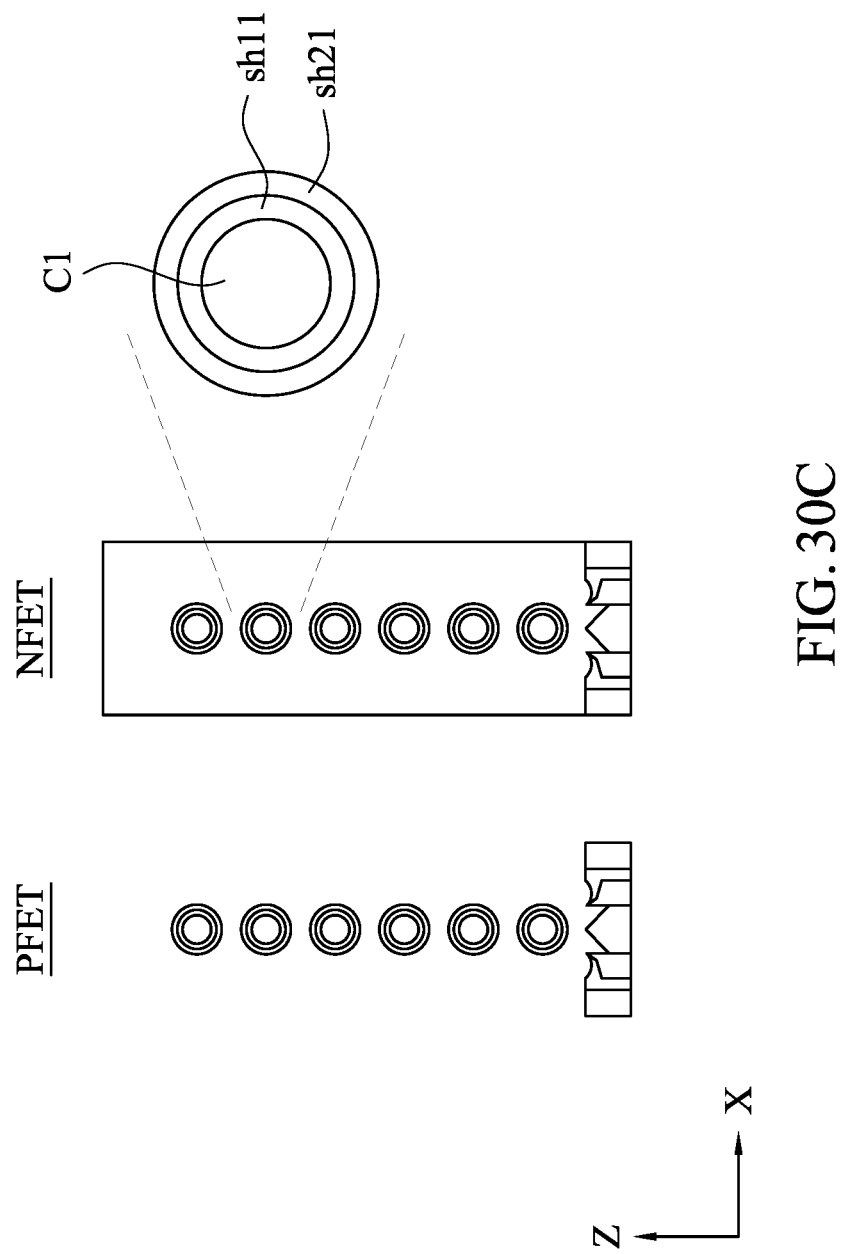
Figure 30D:
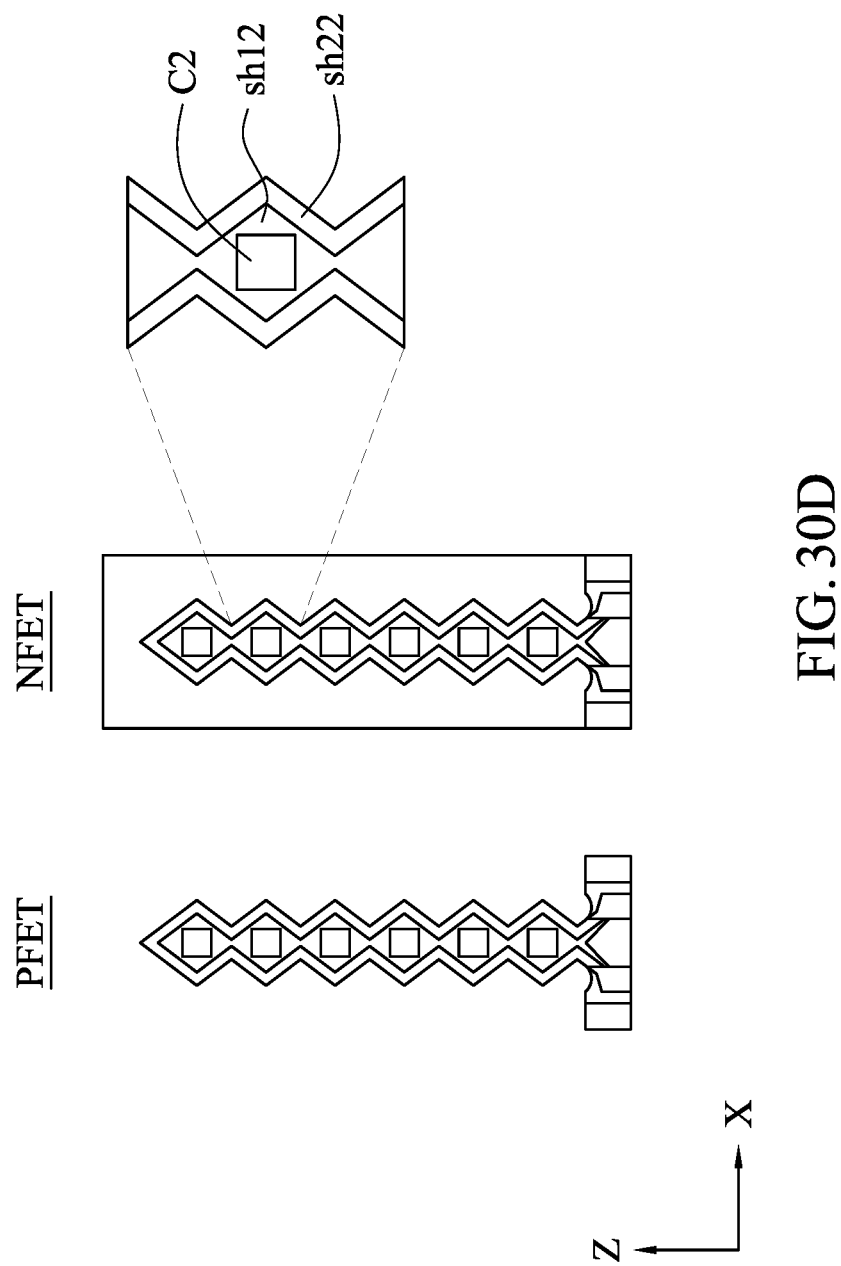
Figures 30E, 30F:
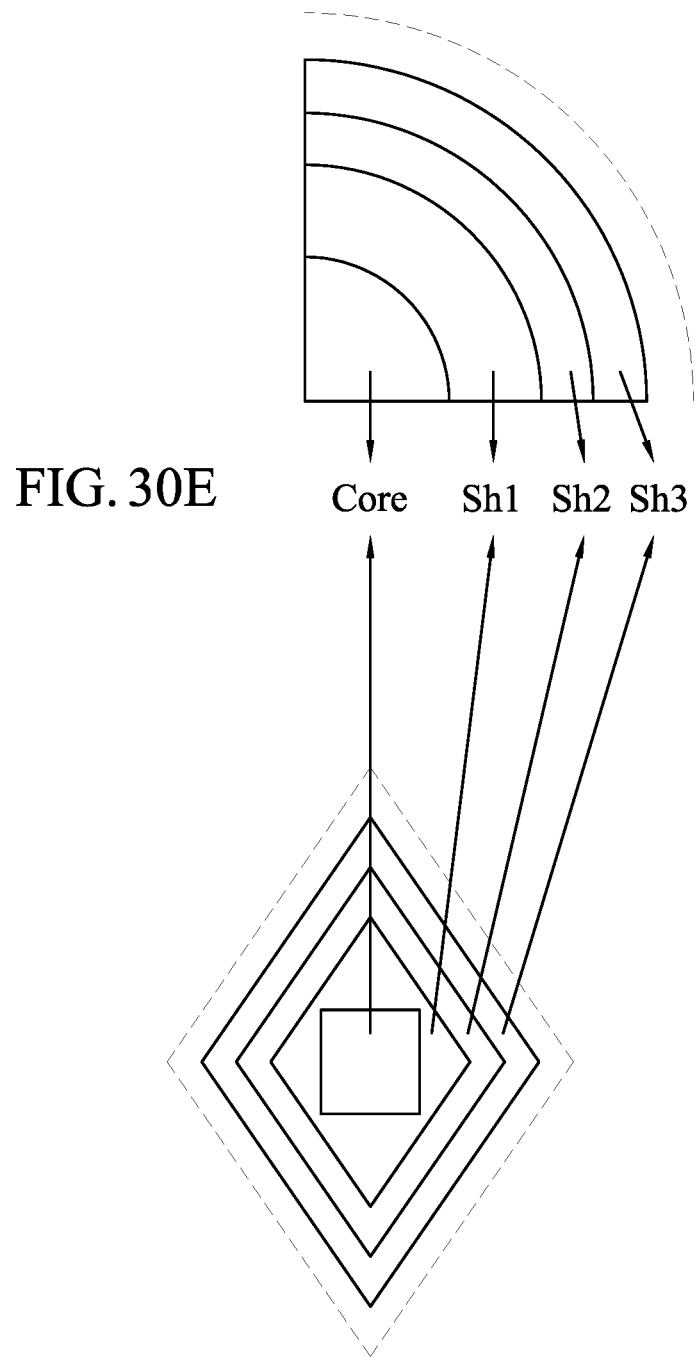

FIGS. 30C-30F show XZ cross-sectional views of wire structures in channel regions of an N-type field-effect transistor (NFET) and a P-type FET (PFET). The core region and the shell surround the core region can be cylinders with different cross sectional shapes. For example, the shape of the core region C1 is almost circular, whereas the core region C2 is almost square. In some embodiments, for the wire structure with core region C1, the first and second shell layers Sh11 and Sh21 are almost circular, whereas for the wire structure with core C2, the first and second shell layers Sh12 and Sh22 are almost rhombus (diamond) shape, in some embodiments. In the embodiments of FIG. 30C, the wire structures are separated from one another, whereas in the embodiments of FIG. 30D the wire structures are connected to one another through one of the shell layers, for example, the first shell layer, the second shell layer etc. In some embodiments, as shown in FIGS. 30E and 30F, the wire structure is a multi-shell wire structure where the number of shells is more than two, for example three or more. The thickness of shells Sh1, Sh2, Sh3 . . . may be different or the same, in some embodiments. The material of the shells Sh1, Sh2, Sh3 . . . may alternate between Si and Ge, in some embodiments. For example, the shells Sh1, Sh2, Sh3 . . . can be made of Ge, Si, Ge, Si . . . in some embodiments. The shells sh1, sh2, sh3 . . . can be made of Si, Ge, Si, Ge . . . in other embodiments. In some embodiments, the core can be made of $Si_{1-x}$—$Ge_x$, where x in within a range of about 0.1-0.6 or 0.25-0.45. The first shell Sh11 or sh12 can be made of $Si_{1-y}$—$Ge_y$, where y in within a range of about 0.6-1.0 or 0.8-1.0, in some embodiments. In some embodiments, the second shell Sh21 or Sh22 is made of $Si_{1-z}$—$Ge_z$, where z is within a range of about 0-0.4 or 0-0.2. The third shell can be made of $Si_{1-w}$—$Ge_w$, where w is within a range of about 0-1.0 and different from w for the next shell, in some embodiments. In some embodiments, the material for third shell is not limited to SiGe and can include any III-V compound such as InP, InAs, InSb, GaAs, GaSb, InGaAs, and GaAsSb. The thickness of the third shell can be within a range of about 0-1, in some embodiments, or witching a range of about 0.5-6 nm, in other embodiments.

Figure 31A:
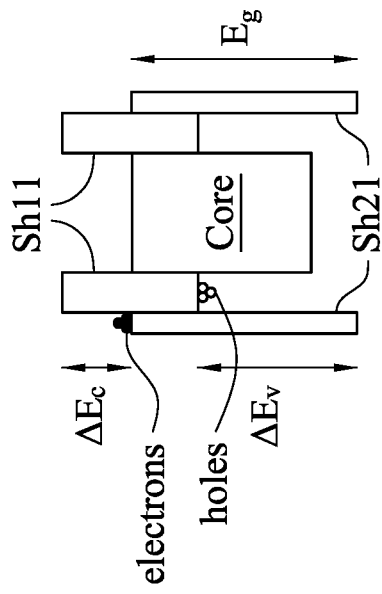
FIGS. 31A, 31B, 31C and 31D show some of various cross-sectional views of multi-layer semiconductor wires and corresponding energy band diagram of a GAA FET device according to one embodiment of the present disclosure.
Figure 31C:
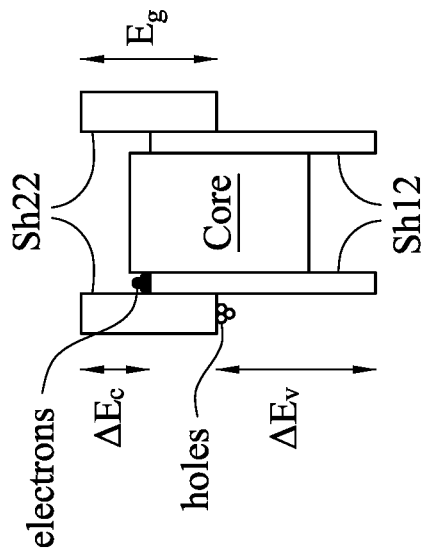
Figure 31B:
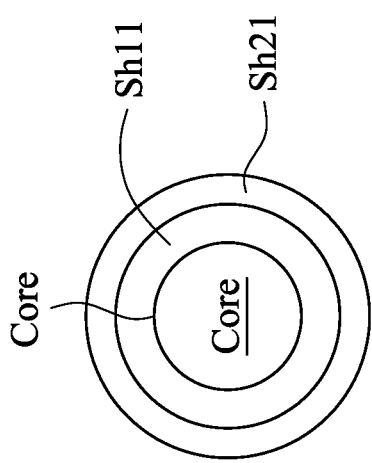
Figure 31D:
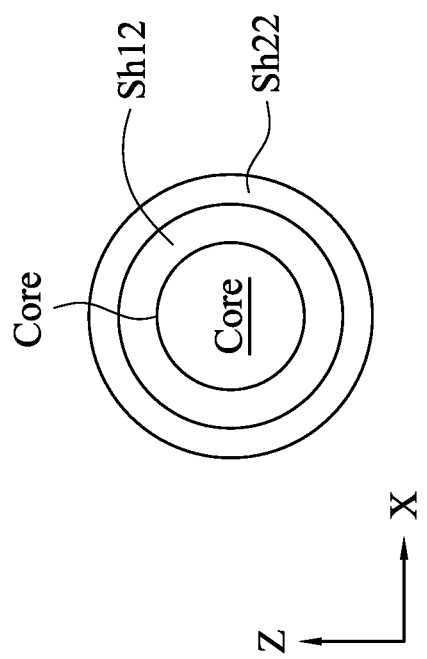

FIGS. 31A-31D show some of various cross-sectional views of multi-layer semiconductor wires and corresponding energy band diagram of a GAA FET device according to one embodiment of the present disclosure. The wire structure in FIG. 31A has a core that is made of $Si_{1-x}$—$Ge_x$, where x in within a range of about 0.1-0.6 or 0.25-0.45, and is relaxed or experiences tensile stress by the first shell. A first shell Sh11 made of $Si_{1-y}$—$Ge_y$, where y in within a range of about 0.6-01.0 or 0.8-1.0 with compressive stress. A second shell sh21 is made of $Si_{1-z}$—$Ge_z$, where z in within a range of about 0-0.4 or 0-0.2 with tensile stress. The wire structure in FIG. 31B has a core that similar to the core of the wire structure of FIG. 31A. The first and the second shells Sh12 and Sh22 of FIG. 31B are similar to the shells Sh21 and Sh11 of FIG. 31A, respectively. In an embodiment, the shells sh11 and sh22 can be made of Ge and shells Sh21 and Sh12 can made of Si. Example values of the dimensions of the core, the first shell Sh11, and the second shell Sh21 are as shown in FIGS. 31C and 31D. In some embodiments, a width of the core can be within a range of about 2-5 nm. The thickness of the first shell Sh11 can be within a range of about 1-3 nm in some embodiments. In some embodiments, the thickness of the second shell Sh21 can be within a range of about 0.1-1.5 nm, in some embodiments.

It has also been shown theoretically and confirmed experimentally that mechanical stress in the channel region of a FET device can increase or decrease carrier mobility significantly, depending on the sign of the stress (e.g. tensile or compressive) and the carrier type (e.g. electron or hole). For example, tensile stress increases electron mobility and decreases hole mobility while compressive stress increases hole mobility while decreasing electron mobility in the doped semiconductor crystal lattice forming the transistor channel.

FIG. 31C shows an energy band structure corresponding to the wire structure of FIG. 31A. The first shell sh11 (e.g., Ge) in FIG. 31C is under compressive stress and has a higher valence band edge energy ($E_{V1}$), compared to the second shell sh21, and the second shell sh21 (e.g., Si) is under tensile stress and has a lower conduction band edge energy ($E_{C2}$), as compared to the first shell sh11. For example, the difference $\Delta E_V$ between $E_{V1}$ of first shell sh1 and $E_{V2}$ of the second shell sh21 ($\Delta E_V = E_{V1} - E_{V2}$) is more than about 630 meV and the difference $\Delta E_C$ between $E_{C2}$ of the second shell sh21 and $E_{C1}$ of the first shell sh1 ($\Delta E_C = E_{C1} - E_{C2}$) is about 170 meV. The higher $E_{V1}$ of the Ge shell (sh21) cause accumulation of holes in the Ge shell. Whereas, the lower $E_C$ of the Si shell (sh2) causes accumulation of electrons in the Si shell. In some embodiments, the core can also have compressive or tensile stress and higher $E_v$ or lower $E_c$ for hole and electron.

FIG. 31D shows an energy band structure corresponding to the wire structure of FIG. 31B. The first shell sh12 (e.g., Si) in FIG. 31C is under tensile stress and has a lower conduction band edge energy ($E_{C1}$), compared to the second shell Sh22, and the second shell Sh22 (e.g., Ge) has compressive stress and has a higher valence band edge energy ($E_{V2}$), as compared to the first shell sh12. For example, the difference $\Delta E_C$ between $E_{C1}$ of first shell Sh12 and $E_{C2}$ of the second shell sh22 ($\Delta E_C = E_{C2} - E_{C1}$) is about 170 meV and the difference $\Delta E_V$ between $E_{V2}$ of second shell Sh22 and $E_{V1}$ of the first shell Sh12 ($\Delta E_V = E_{V2} - E_{V1}$) is more than about 630 meV. The higher $E_{V2}$ of the Ge shell (Sh22) cause accumulation of holes in the Ge shell. Whereas, the lower $E_C$ of the Si shell (Sh12) causes accumulation of electrons in the Si shell. In some embodiments, the core can also have compressive or tensile stress and higher $E_v$ or lower $E_c$ for hole and electron.

It is understood that the GAA FETs undergo further CMOS processes to form various features such as contacts/vias, interconnect metal layers, dielectric layers, passivation layers, etc.

The various embodiments or examples described herein offer several advantages over the existing art. For example, in the present disclosure, the S/D epitaxial layer can function as an etch stop layer in the channel etching operation, thereby preventing the metal gate electrode from contacting the S/D region. Thus, the GAA FET comprises stacked nanowires (Si and/or SiGe), in which manufacturing process, selective etching at a gate and a source/drain region is performed in the same process step. In the GAA FET, a source/drain layer is fully or partially epitaxially grown on etched Si or SiGe stacked layers, which enhances surface area for contact landings. Further, with the foregoing configuration, a more S/D epitaxial layer with a dopant can be grown, which reduces a contact resistance between the S/D epitaxial layer and the contact plus on the S/D epitaxial layer.

Figure 32C:
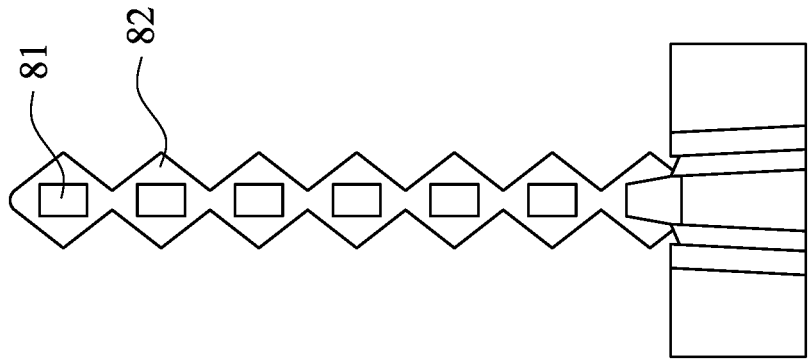
FIGS. 32A, 32B, 32C, 32D, and 32E show some of various core-etchings and corresponding first shell epitaxial growth over the etched-cores according to one embodiment of the present disclosure.
Figure 32B:
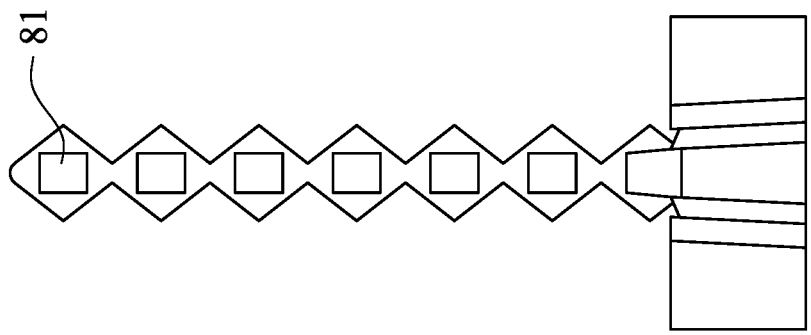
Figure 32A:
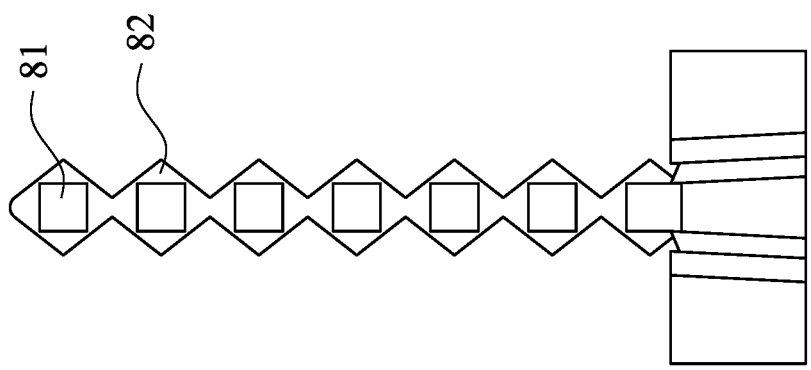

FIGS. 32A, 32B, 32C, 32D, and 32E show a range of core rounding and corresponding first shell epitaxial growth over the rounded cores according to one embodiment of the present disclosure. The structure shown in FIG. 32A depicts core regions 81 (e.g., of Si) covered by first shell layers 82 (e.g., of Ge) epitaxially formed on the core regions 81. In the structure of FIG. 32A, the core regions are not etched, before growing the first shell layers 82, and have their full volume. In the structures shown in FIGS. 32B, 32C, and 32D, increasing amounts of the volume of the core regions 81 are etched to shrink the volume of the core regions 81 before the first shell layers 82 are grown. It is understood that the thickness of the shell layer 82 that is plausible is dependent on the shrinkage of the core regions 81. For example, as shown by the structures shown in FIGS. 32B, 32C, and 32D, as the shrinkage by etching of the volume of the core regions 81 is increased, the thickness of the plausible first shell layers 82 are increased. In some embodiments, the volume shrinkage of the core regions 81 can be within a range of about 0%-90%. In some embodiments, the volume shrinkage of the core regions 81 can be within a range of about 20%-70%.

Figure 32E:
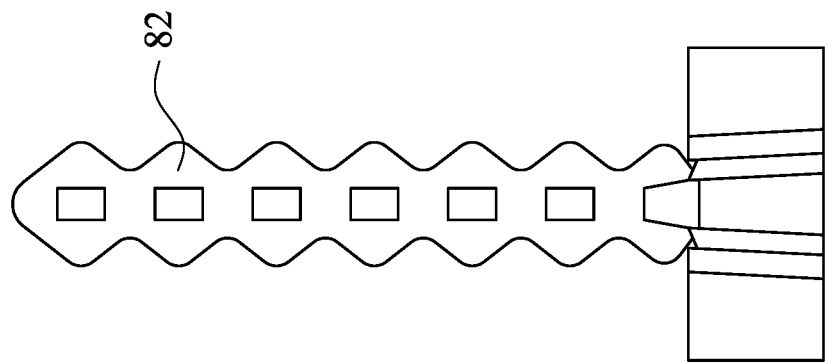
Figure 32D:
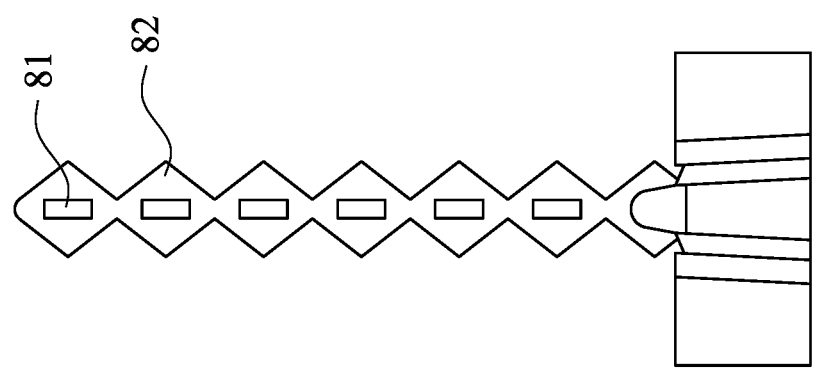

The first shell layer epitaxial growth process is a self-limiting process due to (111) diamond surface formation. Despite the size of the core region, at the onset of connection of grown diamond-like first shell layers of adjacent wires, the wires have the largest effective width (Weff) and the shell layer has a totally (111) surface. The best situation of shell growth is around this onset point. As shown in FIG. 32E, further overgrowth becomes fin structure and loses nanowire characteristic. The intentionally tuning of shell growth to form circular-covered shape has more constrains, as it needs to take channel and IL/HK/MG thickness into consideration. Core-shell radius with IL/HK thickness must smaller than half spacing of the wires.

Figure 33:
FIG. 33 is table showing some of various properties of a multi-layer semiconductor wire of a GAA FET device according to one embodiment of the present disclosure.

FIG. 33 is Table 95 showing some of various properties of a multi-layer semiconductor wire of a GAA FET device according to one embodiment of the present disclosure. Table 95 is a technology computer aided design (TCAD) simulation result of a wire structure with a core and one or more shells with different structures, showing various stress values $S_{xx}$, $S_{yy}$, and $S_{zz}$ in giga Pascal (GPa). The x and z directions are the lateral directions and y is the direction along the length of the wire structure (e.g., see x-z axis in FIG. 30B). For example, column 95-1 describes a multi-layer semiconductor wire with a core and an inner (first) shell and outer (second) shell. The core is $Ge_x$ with x=0.5, inner shell is Ge and outer shell is Si. The values of stresses $S_{xx}$, $S_{yy}$, and $S_{zz}$ for the inner shell are −3.2, −1.6, and −1.6 GPa (compressive stress for PFET), respectively, whereas for the outer shell, the values for the same stresses are 4.8, 2.7, and 2.7 (tensile stress for NFET), respectively. The columns 95-2 is for two shell wires with cores made of $Si_{1-x}Ge_x$ with x=0.3, inner shell is 60% Ge and outer shell is Si. For this column (95-2), the values of stresses $S_{xx}$, $S_{yy}$, and $S_{zz}$ for the inner shell are −2.1, −1.0, and −1.0 GPa, respectively, whereas for the outer shell, the values for the same stresses are 2.9, 1.6, and 1.7, respectively. The description of the column 95-3 can be similarly read from the Table 95. Column 95-4 shows stress values for a comparative p-channel last (PCL) device, where hole mobility is low due to a biaxial type of stress, which is not a suitable type of stress for this device. Column 95-5 shows mobility preferred stress for NFET and PFET. For example, for NFET, tensile $S_{xx}$ and $S_{yy}$, and compressive $S_{zz}$ are desired, whereas for PFET, compressive $S_{xx}$ and tensile $S_{yy}$ and $S_{zz}$ are desired. Further, the uniaxial is the desired type of stress for channels of both NFET and PFET devices.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a multi-layer structure of first semiconductor layers and second semiconductor layers alternately stacked is formed in a first direction over a substrate. The multi-layer structure is patterned into a fin structure. A sacrificial gate structure is formed over the fin structure. The sacrificial gate structure covers a first part of the fin structure and leaves a second part of the fin structure exposed. The first part of the fin structure includes a channel region and the second part of the fin structure includes source/drain regions. Epitaxial source/drain structures are formed on the fin structure in the source/drain region. The sacrificial gate structure is removed to expose the channel region. The second semiconductor layers is removed in the channel region thereby exposing the first semiconductor layers in the channel region to form spaced apart core layers in the in the channel region. One or more semiconductor shell layers are formed at least partially around the core layers in the channel region to form multilayer semiconductor wires. Each of the multilayer semiconductor wires include a core layer at least partially wrapped around with the one or more semiconductor shell layers. A gate dielectric layer and a gate electrode layer are formed around the multilayer semiconductor wires in the channel region.

In some embodiments, the first semiconductor layers includes Si or a Si-based compound, and the second semiconductor layers includes SiGe having a different composition than the first semiconductor layers. In some embodiments, the core layer includes a $Ge_x$ semiconductor and each of the multilayer semiconductor wires includes a first shell made of a Ge epitaxial layer covering the core layer and a second shell made of a Si epitaxial layer covering the first shell. In some embodiments, the epitaxial source/drain structures include at least one of SiP, SiCP and SiC. In some embodiments, the core layer includes a $Ge_x$ semiconductor and each of the multilayer semiconductor wires includes a first shell made of a Si epitaxial layer covering the core layer and a second shell made of a Ge epitaxial layer covering the first shell, and the epitaxial source/drain structures include at least one of SiP, SiCP and SiC.

In some embodiments, the core layer includes a cylinder with a substantially circular cross section, the first and second shells include cylindrical shells having substantially circular cross sections, and the epitaxial source/drain structures include SiGe or Ge. In some embodiments, the core layer includes a cylinder with a substantially rectangular cross section and the first and second shells includes cylindrical shells forming substantially diamond shape cross sections. In some embodiments, a thickness of the core layer is within a range of about 2-8 nm, and a thickness of the first or the second shell is within a range of about 1-5 nm. In some embodiments, one of the first shell or the second shell has a tensile stress and a lower conduction-band edge energy ($E_C$), and another one of the first shell or the second shell has a compressive stress and a higher valence-band edge energy ($E_V$).

In accordance with another aspect of the present disclosure, in a method of manufacturing a semiconductor device a multi-layer structure is formed in a first direction over a substrate. The multi-layer structure includes first semiconductor layers and second semiconductor layers alternately stacked over one another. The multi-layer structure is patterned into a plurality of fin structures. A sacrificial gate structure is formed over the plurality of fin structures. The sacrificial gate structure covers a first part of the plurality of fin structures, while leaving second parts of the plurality of fin structures exposed. The second parts of the plurality of fin structures includes source/drain regions of the plurality of fin structures, and the first part of the plurality of fin structures is a channel regions of the plurality of fin structures. The sacrificial gate structure is removed to expose the channel regions of the plurality of fin structures. The second semiconductor layers in the channel regions of the plurality of fin structures are removed, thereby exposing first semiconductor layers in the channel regions of the plurality of fin structures to form spaced apart core layers in the channel regions of the plurality of fin structure. The spaced apart core layers in the channel regions are rounded. One or more semiconductor shell layers are formed at least partially around the rounded core layers in the channel regions to form multilayer semiconductor wires. Each of the multilayer semiconductor wires include a core layer at least partially wrapped around with the one or more semiconductor shell layers. A gate dielectric layer and a gate electrode layer are formed around the multilayer semiconductor wires in the channel regions of the plurality of fin structures. A first shell layer of the one or more semiconductor shell layers is connected to an adjacent first shell layer corresponding to a neighboring multilayer semiconductor wire.

In some embodiments, an epitaxial source/drain structures is also over the first and second semiconductor layers in the source/drain regions of the plurality of fin structures. In some embodiments, the core layer include a $Ge_x$ semiconductor and the one or more semiconductor shells includes a first shell made of a Ge epitaxial layer covering the first core layer and a second shell made of a Si epitaxial layer covering the first shell. In some embodiments the epitaxial source/drain structures include at least one of SiP, SiCP and SiC. In some embodiments, the core layer includes a cylindrical core having a substantially circular cross section and the first and second shells include cylindrical shells having substantially circular cross sections, and the epitaxial source/drain structures include SiGe or Ge. In some embodiments, the core layer includes a cylindrical core having a substantially rectangular cross section and the first and second shells include cylindrical shells forming substantially diamond shape cross sections.

In some embodiments, a thickness of the core layer is within a range of about 2-4 nm, and a thickness of the first or the second shell is within a range of about 1-2 nm. In some embodiments, one of the first shell or the second shell has a tensile stress and a lower conduction-band edge energy ($E_C$), and another one of the first shell or the second shell has a compressive stress and a higher valence-band edge energy ($E_V$). In some embodiments, the first semiconductor layers comprise Si or a Si-based compound, and wherein the second semiconductor layers comprise SiGe.

In accordance with another aspect of the present disclosure, a semiconductor device includes channel layers disposed over a substrate, a source/drain region disposed over the substrate, a gate dielectric layer disposed on and wrapping each of the channel layers, and a gate electrode layer disposed on the gate dielectric layer and wrapping each of the channel layers. Each of the channel layers includes a semiconductor wire made of a core region, and one or more shell regions. The core region has an approximately square-shape cross section and a first shell of the one or more shells forms a first shell region of an approximately rhombus-shape cross section around the core region and is connected to an adjacent first shell region corresponding to a neighboring semiconductor wire.

In some embodiments, the semiconductor wire extends into the source/drain region, the one or more shell regions includes a first shell and a second shell, and the core region includes a first semiconductor material. In some embodiments, the first shell includes a second semiconductor material, and the second shell includes a third semiconductor material. In some embodiments, the core region includes a $Si_xGe_y$ material and one of the second semiconductor material or the third semiconductor material has a lower conduction-band edge energy ($E_C$) and is under tensile stress.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a channel region disposed over a substrate;
a source/drain region connected to the channel region and disposed over the substrate; and
a gate structure disposed over the channel region and including a gate dielectric layer disposed over the channel region and a gate electrode layer disposed on the gate dielectric layer, wherein:
the channel region includes core regions, which are vertically arranged semiconductor bodies, and a first shell and a second shell,
each of the core regions has a cross section having rounded corners,
the first shell wraps each of the core regions and is continuously formed on the core regions thereby connecting the core regions,
the second shell is disposed on an outer surface of the first shell, and
the channel region further includes a third shell having different composition than the second shell and disposed over the second shell.

2. The semiconductor device of claim 1, wherein:
a minimum width of the first shell between adjacent core regions is smaller than a width of each of the adjacent core regions.

3. The semiconductor device of claim 1, wherein:
a top of the second shell has a triangular peak.

4. The semiconductor device of claim 1, wherein:
the core region has a square shape having rounded corners in the cross section.

5. The semiconductor device of claim 1, wherein:
the core regions are made of a Si Ge semiconductor,
the first shell is made of a Ge epitaxial layer
the second shell is made of a Si epitaxial layer.

6. The semiconductor device of claim 1, wherein:
the core regions are made of $Si_{1-x}Ge_x$, where x in a range from 0.1 to 0.6,
the first shell is made of $Si_{1-y}Ge_y$, where y in a range of 0.6 to 1.0, and
the second shell is made of $Si_{1-z}Ge_z$, where z is in a range from 0 to 0.4.

7. The semiconductor device of claim 1, wherein:
the core regions are made of $Si_{1-x}$—$Ge_x$, where x in a range from 0.25 to 0.45,
the first shell is made of $Si_{1-y}$—$Ge_y$, where y in a range of 0.8 to 1.0, and
the second shell is made of $Si_{1-z}Ge_z$, where z is in a range from 0 to 0.2.

8. The semiconductor device of claim 1, wherein:
a thickness of each of the core regions is in a range from 2 nm to 4 nm, and
a thickness of at least one of the first shell and the second shell is in a range from 1 nm to 2 nm.

9. The semiconductor device of claim 1, wherein the third shell is made of a SiGe semiconductor.

10. The semiconductor device of claim 9, wherein:
the core regions are made of $Si_{1-x}Ge_x$, where x in a range from 0.1 to 0.6,
the first shell is made of $Si_{1-y}Ge_y$, where y in a range of 0.6 to 1.0,
the second shell is made of $Si_{1-z}Ge_z$, where z is in a range from 0 to 0.4, and
the third shell is made of $Si_{1-w}$-$Ge_w$, where w is in a range from 0 to 1.0 and w is different from z.

11. The semiconductor device of claim 9, wherein:
the core regions are made of $Si_{1-x}$—$Ge_x$, where x in a range from 0.25 to 0.45,
the first shell is made of $Si_{1-y}$—$Ge_y$, where y in a range of 0.8 to 1.0,
the second shell is made of $Si_{1-z}Ge_z$, where z is in a range from 0 to 0.2, and
the third shell is made of $Si_{1-w}$—$Ge_w$, where w is in a range from 0 to 1.0 and w is different from z.

12. The semiconductor device of claim 1, wherein:
the core regions are made of $Si_{1-x}Ge_x$, where x in a range from 0.1 to 0.6,
the first shell is made of $Si_{1-y}Ge_y$, where y in a range of 0.6 to 1.0,
the second shell is made of $Si_{1-z}Ge_z$, where z is in a range from 0 to 0.4, and
the third shell is made of a Group III-V compound semiconductor.

13. A semiconductor device, comprising:
a channel region disposed over a substrate;
a source/drain region connected to the channel region and disposed over the substrate; and
a gate structure disposed over the channel region and including a gate dielectric layer disposed over the channel region and a gate electrode layer disposed on the gate dielectric layer, wherein:
the channel region includes core regions, which are vertically arranged semiconductor bodies, and one or more shell regions,
in a cross section, each of the core regions has a first dimension along a vertical direction at a center and a second dimension along the vertical direction smaller than the first dimension at the source/drain region, and each of the core regions has rounded corners,
the source/drain region includes a source/drain fin structure having a multi-layer structure of first semiconductor layers, which continuously extend from the core regions and second semiconductor layers made of a different material than the one or more shell regions and alternately stacked, and
a source/drain epitaxial layer wraps around the source/drain fin structure covering a top face and side faces of the source/drain fin structure.

14. The semiconductor device of claim 13, wherein at least one of one or more shell regions is continuously formed on the core regions thereby connecting the core regions.

15. The semiconductor device of claim 14, whereon the source/drain epitaxial layer includes at least one of SiP, SiCP and SiC.

16. The semiconductor device of claim 14, wherein:
the one or more shell regions includes a first shell region wrapping around each of the core regions and a second shell region disposed over the first shell, and
the first shell region is continuously formed on the core regions thereby connecting the core regions.

17. The semiconductor device of claim 16, wherein:

the core regions are made of $Si_{1-x}Ge_x$, where x in a range from 0.1 to 0.6, the first shell region is made of $Si_{1-y}Ge_y$, where y in a range of 0.6 to 1.0, the second shell region is made of $Si_{1-z}Ge_z$, where z is in a range from 0 to 0.4.

18. The semiconductor device of claim 16, wherein:

each of the core regions has a square shape having rounded corners in the cross section, the first shell region has a rhombus outer-shape in the cross section, and the first shell region wrapping one of the core regions is separated from the first shell region wrapping an adjacent one of the core regions.

19. A semiconductor device, comprising:

a channel region disposed over a substrate;

a source/drain region connected to the channel region and disposed over the substrate; and a gate structure disposed over the channel region and including a gate dielectric layer disposed over the channel region and a gate electrode layer disposed on the gate dielectric layer, wherein:

the channel region includes core regions, which are vertically arranged semiconductor bodies along a vertical direction normal to an upper surface of the substrate, and one or more shell regions including a first shell region in direct contact with a corresponding core region, a cross sectional shape of each of the core regions has a rectangular shape with rounded corners and having vertical sides in the vertical direction longer than horizontal sides in a horizontal direction perpendicular to the vertical direction, a thickness of the first shell region measured at the rounded corners is greater than a thickness of the first shell region measured at a side of each of the core regions between two of the rounded corners.

20. The semiconductor device of claim 19, wherein in a cross section, an outer shape of at least one of the one or more shell regions has rounded corners.

* * * * *